US006429733B1

(12) United States Patent
Pagliolo et al.

(10) Patent No.: US 6,429,733 B1
(45) Date of Patent: Aug. 6, 2002

(54) FILTER WITH CONTROLLED OFFSETS FOR ACTIVE FILTER SELECTIVITY AND DC OFFSET CONTROL

(75) Inventors: Joseph P. Pagliolo, Columbia Heights; Steven B. Yates, Minneapolis, both of MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/311,246

(22) Filed: May 13, 1999

(51) Int. Cl.[7] .............................. H03B 1/00; H03K 5/00
(52) U.S. Cl. ....................... 327/552; 327/557; 327/558
(58) Field of Search ................................ 327/551–555, 327/557–559, 307, 52, 54, 65, 67, 77, 87, 89, 336, 345; 330/9, 85, 294, 260, 253–254

(56) References Cited

U.S. PATENT DOCUMENTS

| | | | |
|---|---|---|---|
| 3,643,183 A | 2/1972 | Geffe | 333/80 R |
| 3,715,693 A | 2/1973 | Fletcher et al. | 333/80 T |
| 3,758,885 A | 9/1973 | Voorman et al. | 333/80 T |
| 3,886,469 A | * 5/1975 | Rollett et al. | 327/552 |
| 3,958,185 A | * 5/1976 | Hartung | 330/85 |
| 4,137,504 A | * 1/1979 | Simmons | 327/552 |
| 4,264,874 A | 4/1981 | Young | 330/277 |
| 4,356,451 A | * 10/1982 | Wilson | 327/557 |
| 4,523,109 A | * 6/1985 | Van Roessel | 327/552 |
| 4,529,947 A | 7/1985 | Biard et al. | 330/259 |
| 4,812,785 A | 3/1989 | Pauker | 331/117 FE |
| 4,857,860 A | * 8/1989 | Sevastopoulos | 330/9 |
| 5,006,733 A | * 4/1991 | Brown | 327/553 |
| 5,311,088 A | * 5/1994 | Nelson | 327/552 |
| 5,324,999 A | * 6/1994 | Hunley et al. | 327/553 |
| 5,371,475 A | * 12/1994 | Brown | 330/254 |
| 5,392,003 A | 2/1995 | Nag et al. | 330/254 |
| 5,426,393 A | * 6/1995 | Sevastopoulos | 327/552 |
| 5,430,409 A | 7/1995 | Buck et al. | 330/2 |
| 5,451,898 A | 9/1995 | Johnson | 327/563 |
| 5,642,071 A | 6/1997 | Sevenhans et al. | 327/359 |
| 5,699,016 A | * 12/1997 | Federspiel et al. | 330/260 |
| 5,705,954 A | * 1/1998 | Ishiyama | 330/303 |
| 5,726,603 A | 3/1998 | Chawla et al. | 330/269 |
| 5,767,664 A | 6/1998 | Price | 323/987 |
| 5,809,013 A | 9/1998 | Kackman | 370/253 |
| 5,847,623 A | 12/1998 | Hadjichristos | 332/105 |
| 5,874,840 A | * 2/1999 | Bonaccio | 327/65 |
| 5,933,052 A | * 8/1999 | Peng et al. | 327/554 |
| 5,994,966 A | * 11/1999 | Stikvoort | 327/552 |
| 6,169,432 B1 | * 1/2001 | Sharpe-Geisler | 327/112 |

FOREIGN PATENT DOCUMENTS

EP 0874451 A 10/1998

OTHER PUBLICATIONS

Cheng et al.: "Linear Composite MOSFET Theory, Design, and Applications" IEEE Transactions on Circuits and Systems I; Fundemental Theory and Applications, US, IEEE Inc., New York, vol. 40, No. 5, May 1993, pp. 297–306.*

(List continued on next page.)

Primary Examiner—Terry D. Cunningham
Assistant Examiner—Long Nguyen
(74) Attorney, Agent, or Firm—Kris T. Fredrick

(57) ABSTRACT

A filter is disclosed that actively controls one or more filter characteristics, such as the cut-off frequency of a selected filter pole, while minimizing the value of selected filter components such as the capacitor components. This helps improve the performance, reliability and yield of the filter. The filter rejects a selected frequency component or frequency band by actively providing an offset signal that effectively cancels the rejected frequency component or frequency band, while allowing the remaining frequency components or frequency bands to pass relatively freely to the output of the filter. The offset signal may also be used to actively reject a DC offset voltage or current from the input signal.

25 Claims, 15 Drawing Sheets

OTHER PUBLICATIONS

Cheng M C H et al: "Linear Composite MOSFET: Theory, Design, and Applications" IEEE Transactions on Circuits and Systems I:Fundamental Theory and Applications, US, IEEE Inc. New York, vol. 40, No. 5, May 1, 1993, pp. 297–306, XP000395025, ISSN: 1057–7122, p. 301, col. 1, Line 21 –; col. 2, Line 6; Figure 7,.

Rofougaran et al., "A 900 MHz CMOS RF Power Amplifier with Programmable Output Power", *Proceedings VLSI Circuits Symposium*, Honolulu, Jun. 1994, pp. 133–134.

Rofougaran et al., "A 1GHz CMOS RF Front–End IC for a Direct–Conversion Wireless Receiver", IEEE Journal of Solid–State Circuits, vol. 31, Jul. 1996, pp. 880–889.

Image–Rejection in Mixers, copyright AAA, 1996.

Wilson et al., "A Single–Chip VHF and UHF Receiver for Radio Paging", *IEEE Journal of Solid State Circuits*, vol. 26, No. 12, Dec. 1991, pp. 1945–1950.

Crols et al.,"CMOS Wireless Transceiver Design", Kluwer Academic Publishers, 1997, pp. 17–23...

Chang et al., "A CMOS Channel–Select Filter for a Direct–Conversion Wireless Receiver", to appear in *IEEE Journal of Solid–State Circuits*, Apr. 1999.

Asad A. Abidi, "Direct–Conversion Radio Transceivers for Digital Communications", *IEEE Journal of Solid–State Circuits*, vol. 30, No. 12, Dec. 1995, pp. 1399–1410.

Behzad Razavi, "Design Considerations for Direct–Conversion Receivers", *IEEE Transactions on Circuits and Systems—II: Analog and Digital Signal Processing*, vol. 44, No. 6, Jun. 1997, pp. 428–435.

Thomas H. Lee, "The Design of COMS Radio–Frequency Integrated Circuits", Cambridge University Press, 1998, pp. 344–351.

Product Specification for Advanced Pager Receiver UAA2082, Integrated Circuits, Jan. 16, 1996.

Moulding et al., "Gyrator Video Filter IC with Automatic Tuning", *IEEE Journal of Sold–State Circuits*, vol. SC15, No. 6, Dec. 1980, pp. 963–968.

* cited by examiner

FILTER WITH CONTROLLED OFFSETS FOR ACTIVE FILTER SELECTIVITY AND DC OFFSET CONTROL

CROSS REFERENCE TO CO-PENDING APPLICATIONS

The present application is related to U.S. patent application Ser. No. 09/311,242, filed May 13, 1999, entitled "Output Buffer With Independently Controllable Current Mirror Legs"; U.S. patent application Ser. No. 09/311,105, filed May 13, 1999, entitled "Differential Filter with Gyrator"; U.S. patent application Ser. No. 09/311,234, filed May 13, 1999 entitled "Compensation Mechanism For Compensating Bias Levels Of An Operation Circuit In Response To Supply Voltage Changes"; U.S. patent application Ser. No. 09/311,092, filed May 13, 1999, entitled "State Validation Using Bi-Directional Wireless Link"; U.S. patent application Ser. No. 09/311,250, filed May 13, 1999, entitled "Wireless System With Variable Learned-In Transmit Power"; and U.S. patent application Ser. No. 09/311,014 filed May 13, 1999, entitled "Wireless Control Network With Scheduled Time Slots", all of which are assigned to the assignee of the present invention and incorporated herein by reference.

BACKGROUND OF THE INVENTION

This invention relates to electronic filters, and more particularly, to electronic filters that reject selected frequency components or frequency bands from an electronic input signal, and allow the remaining frequency components or frequency bands to freely pass to the output of the filter.

Most electrical systems include some form of an electrical filter such as a low pass, high-pass, or bandpass filter. These filters are often implemented using known combinations of resistors, inductors and/or capacitors. Typically, the filter characteristics are controlled by the particular configuration and relative values of the resistors, inductors and/or capacitors. Since resistors, inductors and capacitors are all passive components, conventional filter circuits have little or no active control over the filtering characteristics. In addition, since no active gain is provided, the values of the passive components may have to be relatively large. Having large value passive components, especially large value capacitor components, may increase the area and reduce the reliability and/or yield of the filter.

In integrated circuit technologies, capacitors are typically formed using a gate oxide type capacitor. Gate oxide capacitors include a gate oxide layer cladded by a substrate layer and a polysilicon gate layer. The capacitance value of a gate oxide capacitor is primarily dictated by the area of the polysilicon gate region. Even though the gate oxide layer is relatively thin, the amount of capacitance that can be generated per unit area is relatively small. Therefore, to generate an adequate capacitance value for many filter applications, the area of the gate oxide capacitor must be relatively large.

In many integrated circuit processes, the gate oxide layer may be susceptible to pinholing, wherein one or more pinhole defects in the gate oxide effectively short the substrate to the polysilicon gate layer. The probability of having a pinhole in any given circuit is typically dependent on the total gate oxide area in the circuit. Thus, when large gate oxide capacitors are used, the chance of having one or more pinholes in the circuit increases, and the overall reliability and/or yield of the circuit may decrease.

Therefore, it would be desirable to provide a filter that provides more active control over the filtering characteristics. It would also be desirable to provide a filter that minimizes the value of selected filter components, and in particular, capacitor components. This may help reduce the area, increase the reliability and yield, or otherwise improve the performance of the filter.

SUMMARY OF THE INVENTION

The present invention overcomes many of the disadvantages of the prior art by providing a filter that actively controls one or more of the filter characteristics. The present invention also provides a filter that helps minimize the value of selected filter components, and in particular, capacitor components. Finally, the present invention may be used to provide a filter that actively rejects a DC offset voltage or current from an input signal.

In an illustrative embodiment, a filter is provided that rejects a selected frequency component or frequency band from an input signal by actively providing an offset signal that effectively cancels out the rejected frequency component or frequency band, while allowing the remaining frequency components or frequency bands to freely pass to the output of the filter. It is contemplated that such a filter may be either a high-pass filter, a low pass filter or a band pass filter, and may be applied to either a single ended or differential input signal. In a high-pass filter, the offset signal may also be used to actively reject a DC offset voltage or current from the input signal.

For a single ended input signal, the filter may include, for example, a control circuit that provides a control signal that is related to the amplitude of the input signal. The amplitude is typically expressed as the difference between the input signal and a reference voltage, such as ground. In one embodiment, the control circuit is a buffer circuit that has a single input port for receiving the input signal. The buffer circuit can be inverting or non-inverting, depending on the application. The control circuit may alternatively be a differential amplifier circuit having a first input port and a second input port, wherein the input signal is provided to the first input port and a reference signal (e.g. ground) is provided to the second input port.

An offset circuit is also provided for receiving the control signal, and for providing an offset signal to the input terminal of the filter. The offset signal preferably effectively cancels out the input signal at the first frequency, and does not substantially effect the input signal at the second frequency. This is preferably accomplished by connecting a filter to the control signal. The filter may be provided either inside or outside of the offset circuit. In either case, the filter preferably substantially prevents the control signal from tracking the input signal at the second frequency, while substantially allowing the control signal to track the input signal at the first frequency. Alternatively, the filter may substantially prevent the control signal from tracking the input signal at the first frequency, while substantially allowing the control signal to track the input signal at the second frequency. The first frequency may be higher or lower than the second frequency.

The offset circuit may include an offset transistor, where the gate of the transistor receives the control signal. The source of the offset transistor may be coupled directly or indirectly to a reference voltage, such as VDD or ground. The drain of the offset transistor may be coupled to the input terminal of the filter. In this configuration, the control signal controls the conductivity of the offset transistors and thus the offset current supplied to the input signal.

To create a high-pass filter, the filter that is connected to the control signal may be a capacitor. The capacitor may be coupled between the control signal and ground. At low frequencies, the capacitor appears as an open, and the control signal is passed to the offset transistor relatively unencumbered. Accordingly, the offset transistor may provide an offset current that, for example, pulls the input signal high each time the input signal attempts to go low. Alternatively, and depending on the relative polarity of the control circuit and the offset transistor, the offset transistor may provide an offset current that, for example, pulls the input signal low each time the input signal attempts to go high. In either case, the input signal may remain in one state at low frequencies.

As the frequency increases beyond the high-pass pole, the capacitor begins to appear as an AC short to ground. Therefore, the control signal is substantially prevented from reaching the offset transistor, thereby removing the effect of the offset current from the filter.

It is contemplated that the capacitor may be any type of filter circuit, and may include a collection of resistors, inductors (or gyrators), and/or capacitors. Accordingly, it is contemplated that the control signal provided by the control circuit may be filtered using a low pass filter, a high-pass filter or a bandpass filter, whichever is appropriate for the particular application.

If the control circuit has gain, the capacitance required to achieve the desired high-pass pole is reduced. This may reduce the area, increase the reliability and yield, or otherwise improve the performance of the filter. For a differential input signal, the filter may include, for example, a comparator for comparing the positive and negative input signals of the differential input signal. The comparator may provide one or more control signals that are related to the difference between the positive and negative input signals. An offset circuit receives the one or more control signals, and provides one or more offset signals to the positive and negative input signals of the differential input signal. The offset signals preferably effectively remove the difference between the positive input signal and the negative input signal of the differential input signal at the first frequency, and have substantially no effect on the difference between the positive input signal and the negative input signal of the differential input signal at the second frequency. When the second frequency is higher than the first frequency, the resulting filter may be a high-pass filter. When the second frequency is lower than the first frequency, the resulting filter may be a low pass filter.

Because the offset signals preferably effectively remove the difference between the positive input signal and the negative input signal of the differential input signal at the first lower frequency, the DC offset in the differential input signal will also be actively removed by the filter.

The comparator preferably includes a differential amplifier having a positive input port, a negative input port, a positive output port and a negative output port. The offset circuit preferably includes a differential pair of transistors each having a gate. The gate of a first one of the differential pair of transistors is preferably coupled to the positive output port of the differential amplifier, and the gate of a second one of the differential pair of transistors is preferably coupled to the negative output port of the differential amplifier circuit.

The source terminals of the first and second differential pair of transistors are preferably coupled directly or indirectly to a reference voltage, such as VDD. The drain of the first one of the differential pair of transistors is preferably coupled to the positive input port of the differential amplifier. The drain of the second one of the differential pair of transistors is preferably coupled to the negative input port of the differential amplifier. In this configuration, the control signals control the offset currents supplied to the positive input port and negative input port of the differential amplifier.

To create a high-pass filter, a first capacitor may be coupled between the gate of the first one of the differential pair of transistors and ground, and a second capacitor may be coupled between the gate of the second one of the differential pair of transistors and ground. Preferably, the first capacitor and the second capacitor are matched, although this is not required.

At low frequencies, the first and second capacitors will appear as opens, and the feedback path from the outputs of the differential amplifier to the differential pair of transistors will be relatively unencumbered. Accordingly, the differential pair of transistors may provide offset currents that force the positive input port and negative input port of the differential amplifier to be substantially equal. As indicated above, this not only actively controls (e.g., eliminates) the DC offset between the positive and negative input signals of the differential input signal, but also provides a high-pass pole.

As the frequency increases beyond the high-pass pole, the first and second capacitors begin to appear as AC shorts to ground. This effectively prevents the AC control signals from reaching the gate terminals of the differential pair of transistors, thereby removing the effects of the offset current from the filter.

It is contemplated that the first and second capacitors may be any type of filter circuit, and may include a collection of resistors, inductors (or gyrators), and/or capacitors. Accordingly, it is contemplated that the control signals provided from the differential amplifier to the differential pair of transistors may be filtered using a low pass filter, a high-pass filter or a bandpass filter, as appropriate.

As indicated above, the differential amplifier preferably has significant gain. This may reduce the capacitance required to achieve the desired high-pass pole, thereby reducing the area and potentially increasing the reliability and yield of the filter. A number of methods are also contemplated including methods for filtering single ended and differential input signals. An illustrative method for filtering a single ended input signal includes the steps of: providing a control signal that is related to the difference between the input signal and a reference signal; filtering the control signal to substantially prevent the control signal from tracking the difference between the input signal and the reference signal at the second frequency, but substantially allowing the control signal to track the difference between the input signal and the reference signal at the first frequency; and providing an offset signal, controlled by the control signal, to effectively cancel out the input signal, the offset signal effectively canceling out the input signal only when the control signal substantially tracks the difference between the input signal and the reference signal.

An illustrative method for filtering a differential input signal includes the steps of: comparing the positive input signal and the negative input signal of the differential input signal; providing a control signal that is related to the difference between the positive input signal and the negative input signal; filtering the control signal to substantially prevent the control signal from tracking the difference between the positive input signal and the negative input signal at the second frequency, but substantially allowing the control signal to track the difference between the positive input signal and the negative input signal at the first frequency; and providing offset signals, controlled by the control signal, to effectively cancel out the differential input signal, the offset signals effectively canceling out the differential input signal only when the control signal substantially tracks the difference between the positive input signal and the negative input signal. Other methods are also contemplated.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

The present invention provides a filter that actively controls one or more filter characteristics, such as the cut-off frequency of a selected filter pole, while minimizing the value of selected filter components such as the capacitor components of the filter. This helps improve the performance, reliability and yield of the filter. The present invention also may be used to actively reject a DC offset voltage or current from the input signal.

In accordance with a first illustrative embodiment of the present invention, the filter rejects a selected frequency component or frequency band from an input signal by actively providing an offset signal that effectively cancels out the rejected frequency component or frequency band, while allowing the remaining frequency components or frequency bands to freely pass to the output of the filter. It is contemplated that such a filter may be either a high-pass filter, a low pass filter or a band pass filter, and may be applied to either single ended or differential input signals. In a high-pass filter, the offset signal may also be used to actively reject a DC offset voltage or current from the input signal.

Figure 1:
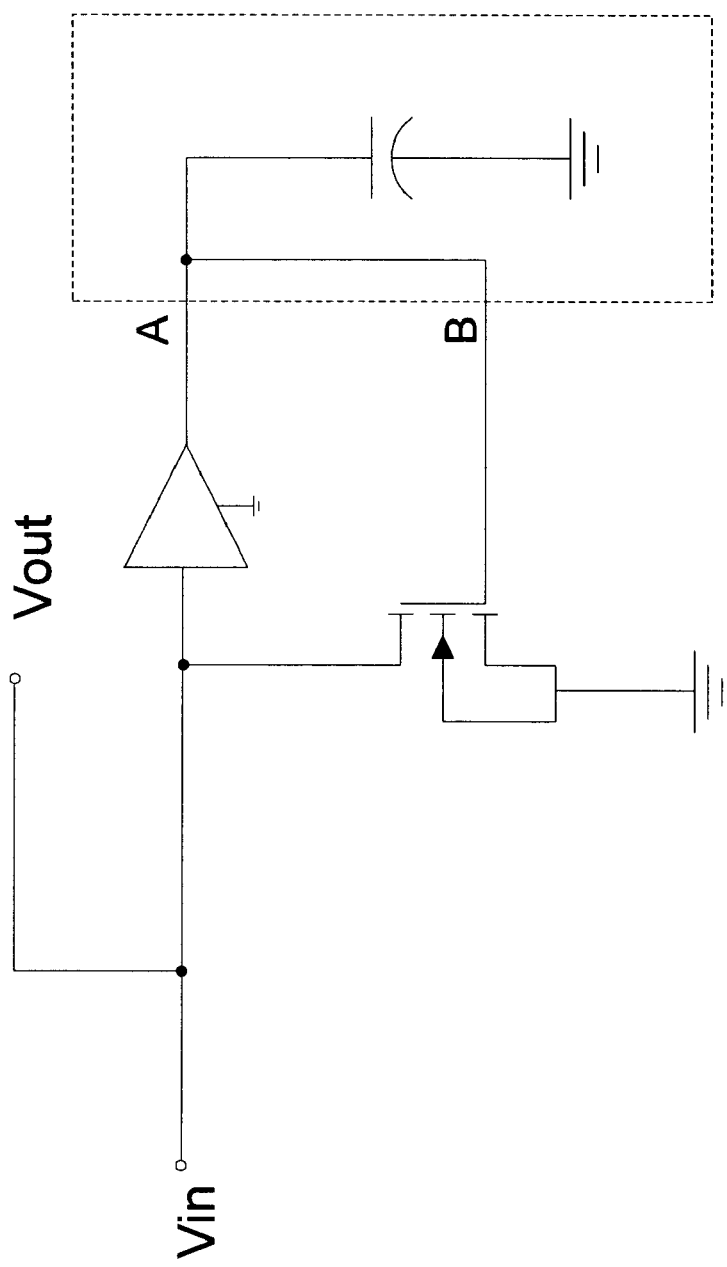
FIG. 1 is a schematic diagram of an illustrative single ended actively controlled filter in accordance with the present invention.

FIG. 1 is a schematic diagram of an illustrative single-ended actively controlled filter in accordance with the present invention. A single ended input signal 10 is provided to the input terminal of a control circuit 12. The control circuit provides a control signal 18. The value of the control signal is preferably related to the amplitude of the input signal 10. In the embodiment shown, the control circuit 12 is a buffer that has a single input port for receiving the input signal 10. The buffer may be inverting or non-inverting, depending on the application.

Offset circuit 14 receives the control signal 18, and provides an offset signal to the input terminal of the filter. The offset signal preferably cancels out the input signal 10 at a first frequency, and does not substantially effect the input signal 10 at a second frequency. In the embodiment shown, the offset circuit 14 is a n-channel offset transistor that has a gate, a drain and a source. The gate of the offset transistor receives the control signal 18. The source of the offset transistor is coupled to ground. The drain of the offset transistor is coupled to the input terminal of the filter. In this configuration, the control signal 18 has direct control over the offset current that is supplied to the input terminal.

To provide a filtering function, a predetermined load or filter 16 is connected to the control signal 18. The load or filter 16 is connected outside of the main signal path from $V_{in}$ to $V_{out}$. In the embodiment shown, the load or filter 16 preferably has two terminals "A" and "B" as shown.

For a high-pass filter, the load or filter 16 may include a capacitor 22 coupled between the control signal 18 and a reference voltage such as ground. At low frequencies, the capacitor 22 appears as an open, and the control signal 18 passes to the offset circuit 14 relatively unencumbered. Accordingly, the offset circuit 14 may provide an offset current that, for example, pulls the input signal low each time the input signal attempts to go high (or visa-versa depending on the polarity of the buffer 12 and the offset transistors 14). Thus, the input signal on input terminal 10 may be forced to remain in one state at low frequencies.

As the frequency increases beyond the high-pass pole, the capacitor 22 begins to appear as an AC short to ground. As such, the AC control signal 18 is effectively prevented from reaching the offset circuit 14. Essentially, the capacitor 22 increases the time constant associated with control signal 18 to be much longer than the switching speed of input signal 10. Accordingly, the offset circuit 14 may have little or no effect on the input signal 10 at high frequencies.

Figure 4B:
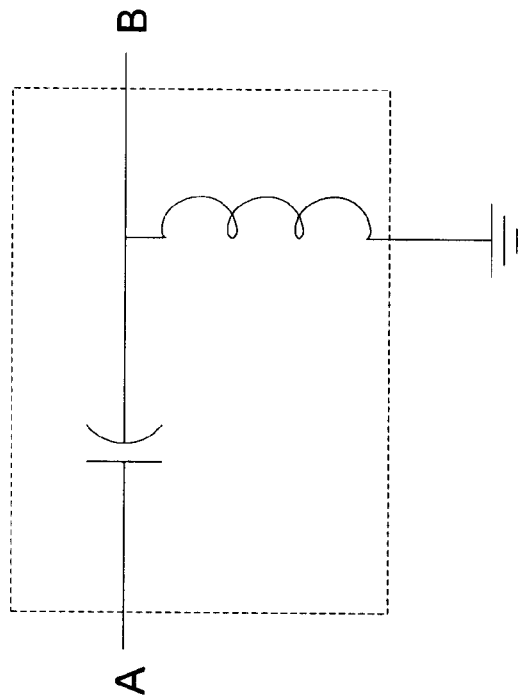
FIGS. 4A–4C are schematic diagrams showing various illustrative filter circuits that can be used in conjunction with the active controlled filters of FIGS. 1–3 to filter the control signal or signals.
Figure 4A:
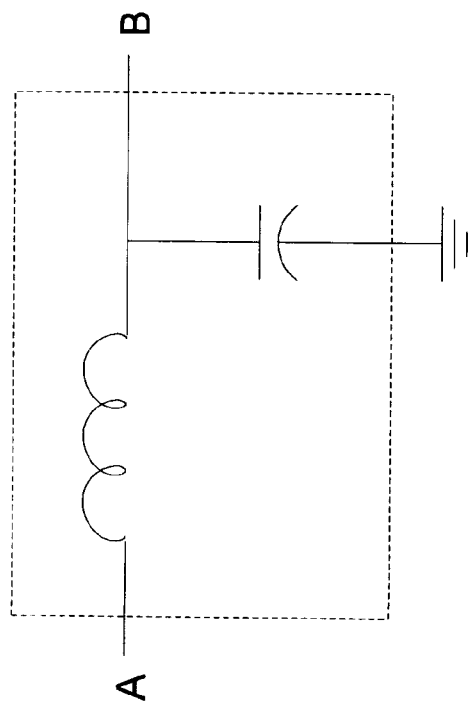
Figure 4C:
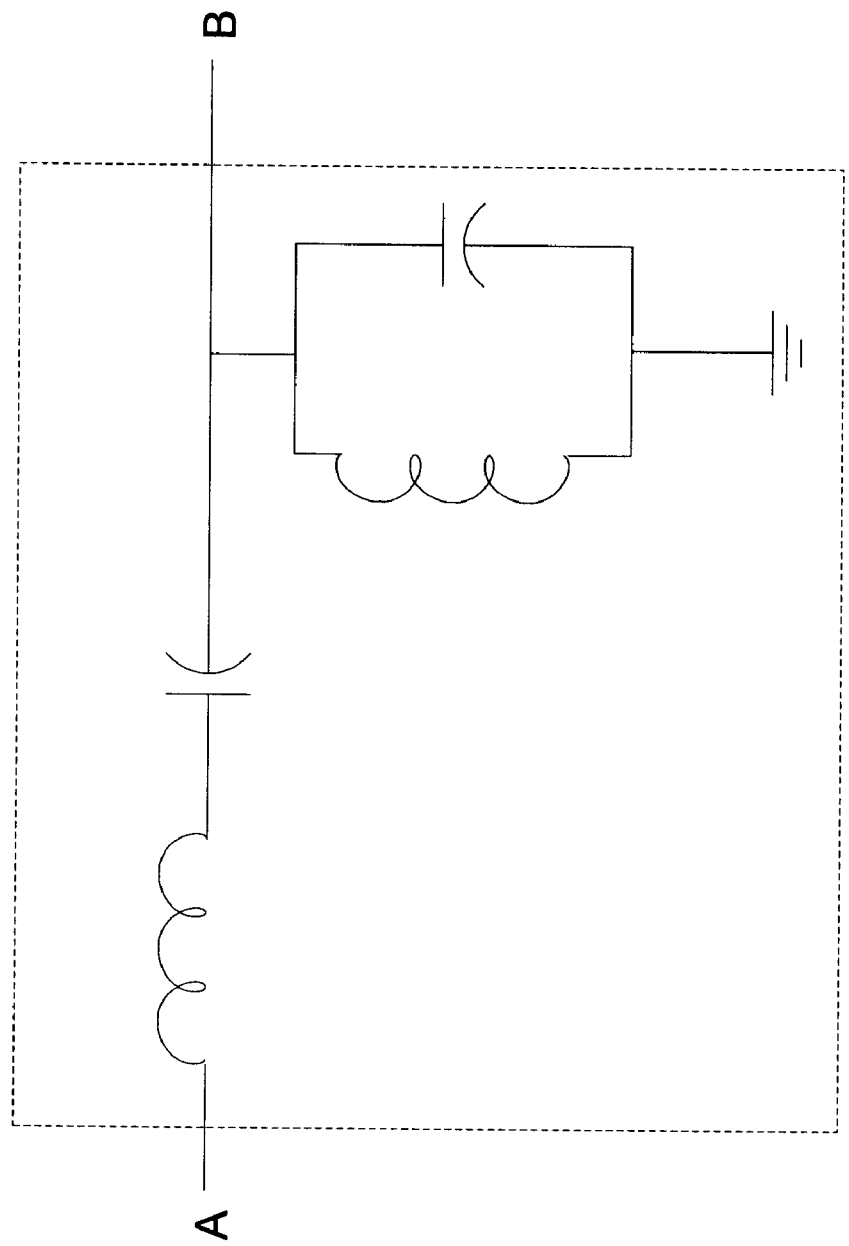

It is contemplated that the capacitor 22 may be any type of filter, and may include a combination of resistors, inductors (or gyrators), and/or capacitors. Accordingly, it is contemplated that the control signal 18 may be filtered using a low pass filter, a high-pass filter or a bandpass filter, whichever is appropriate for the particular application. An illustrative low pass filter is shown in FIG. 4A, an illustrative high-pass filter is shown in FIG. 4B, and an illustrative bandpass filter is shown in FIG. 4C. Each of these filter circuits is described in more detail below.

Figure 2:
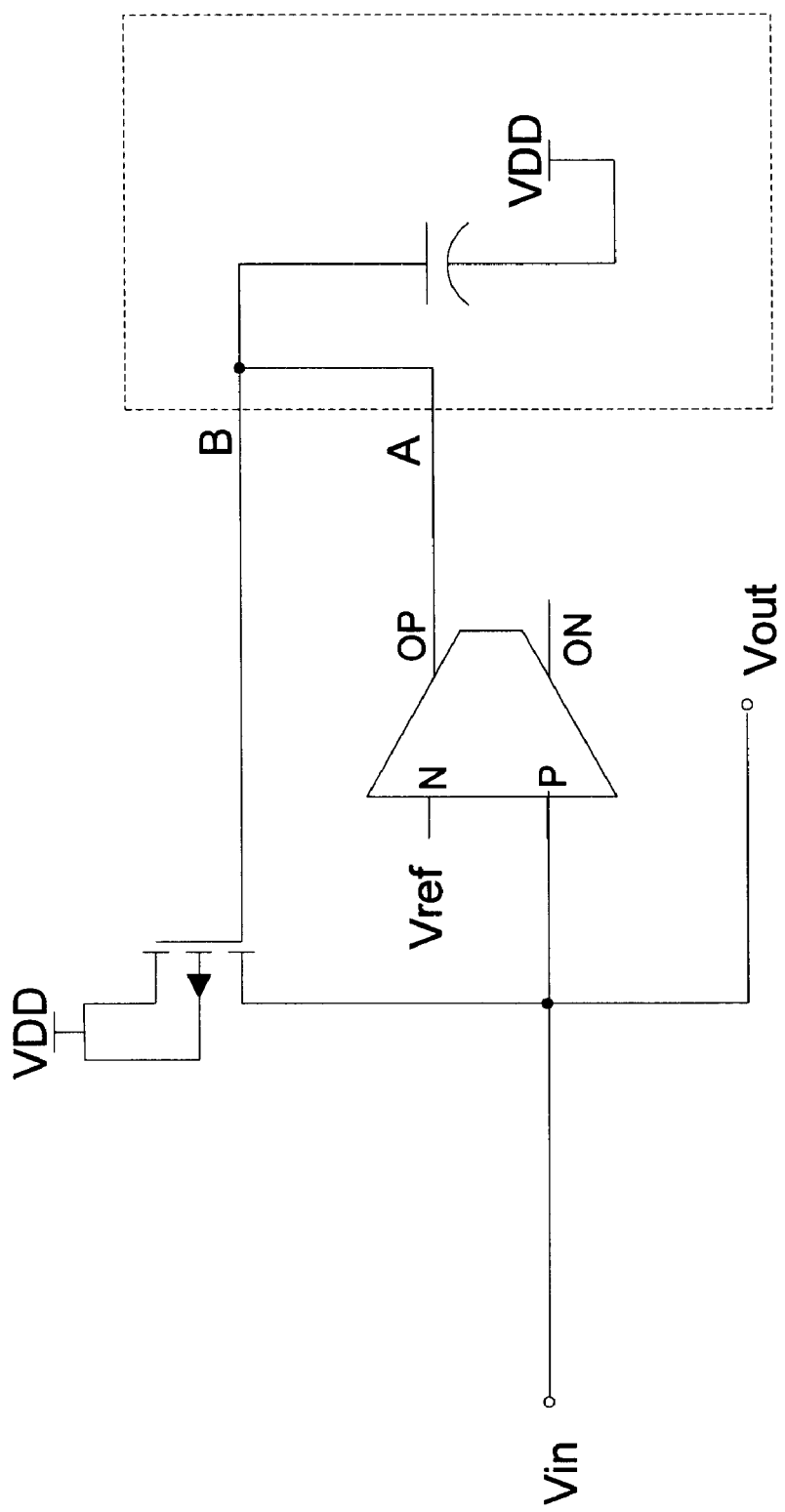
FIG. 2 is a schematic diagram of another illustrative single ended actively controlled filter in accordance with the present invention.

Finally, if the control circuit 12 has gain, capacitance required to achieve the desired high-pass pole is reduced. This may reduce the area, increase the reliability and yield, or otherwise improve the performance of the filter. FIG. 2 is a schematic diagram of another illustrative single ended actively controlled filter in accordance with the present invention. In this embodiment, the single ended input signal 40 is provided to a selected input of a differential amplifier 42. The other input of the differential amplifier is coupled to a reference voltage 46, such as ground. In this configuration, the differential amplifier 42 provides a control signal 48 that is related to the difference between the single ended input signal and the reference voltage 46.

The control signal 48 is routed to offset circuit 50. In the embodiment shown, the offset circuit 50 is a p-channel offset transistor that has a gate, a drain and a source. The gate of the offset transistor 50 receives the control signal 48. The source of the offset transistor 50 is coupled to VDD. The drain of the offset transistor 50 is coupled to the input signal 40. In this configuration, the control signal controls the offset current that is supplied to the input signal 40.

To provide a filter function, a predetermined load or filter 52 is connected to the control signal 48. To create a high-pass filter, a capacitor 56 may be coupled between the control signal 48 and a reference voltage such as VDD. At low frequencies, the capacitor 56 appears as an open, and the control signal 48 passes to the offset circuit 50 relatively unencumbered. Accordingly, the offset circuit 50 may provide an offset current that, for example, pulls the input signal high each time the input signal attempts to go low (or visa-versa depending on the polarity of the buffer 42 and the offset transistors 50). Thus, the input signal 40 may remain in one state at low frequencies.

As the frequency increases beyond the high-pass pole, the capacitor 56 begins to appear as an AC short to VDD. As such, the AC control signal 48 is effectively prevented from reaching the offset circuit 50. Essentially, the capacitor 56 increases the time constant associated with control signal 48 to be much longer than the switching speed of the input signal 40. Accordingly, the offset circuit 50 may have little or no effect on the input signal 40.

Like FIG. 1, it is contemplated that the capacitor 56 may be any type of filter circuit, and may include a collection of resistors, inductors (or gyrators), and/or capacitors. Accordingly, it is contemplated that the control signal 48 may be filtered using a low pass filter, a high-pass filter or a bandpass filter, whichever is appropriate for the particular application.

Figure 3:
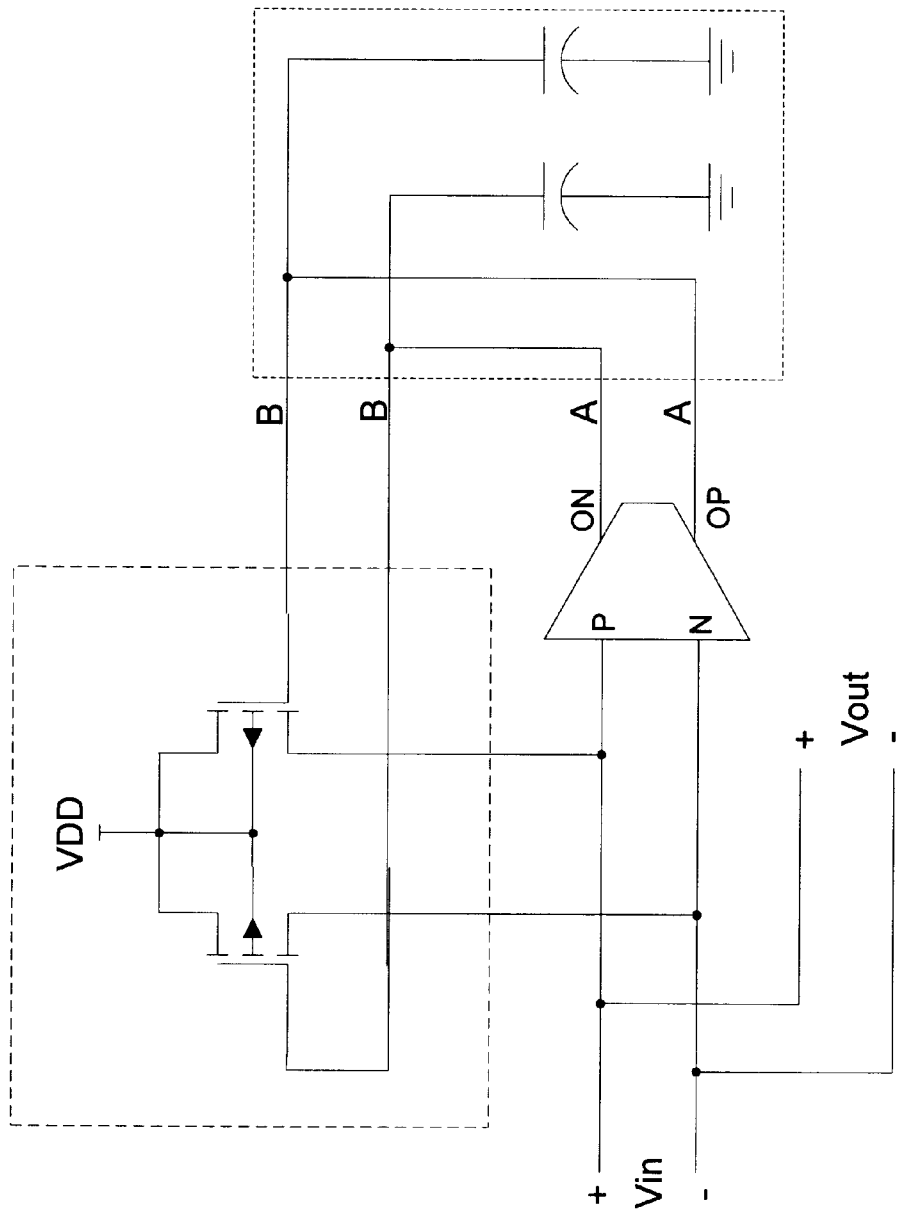
FIG. 3 is a schematic diagram of an illustrative differential actively controlled filter in accordance with the present invention.

FIG. 3 is a schematic diagram of an illustrative differential actively controlled filter in accordance with the present invention. In this embodiment, the filter accepts a differential input signal 70 that has a positive input signal 72 and a negative input signal 74. A comparator 76 compares the positive input signal 72 and the negative input signal 74 and provides one or more control signals 78 and 80 to an offset circuit 98. The control signals 78 and 80 are preferably related to the difference between the positive and negative input signals 72 and 74. The offset circuit 98 receives the one or more control signals 78 and 80, and provides one or more offset signals to the positive input signal 72 and the negative input signal 74 via interfaces 94 and 96, respectively.

The offset signals preferably effectively remove the difference between the positive input signal 72 and the negative input signal 74 of the differential input signal at a first frequency, and have substantially no effect on the difference between the positive input signal 72 and the negative input signal 74 of the differential input signal at a second frequency. When the second frequency is higher than the first frequency, the resulting filter may be a high-pass filter. When the second frequency is lower than the first frequency, the resulting filter may be a low pass filter.

When the offset signals on interfaces 94 and 96 effectively remove the difference between the positive input signal 72 and the negative input signal 74 at a low frequency, any DC offset in the differential input signal 70 will also be actively removed. Thus, the present invention may actively remove any DC offset in an input signal while at the same time actively providing one or more filter poles.

The comparator 76 is preferably a differential amplifier having a positive input port, a negative input port, a positive output port and a negative output port. The offset circuit 98 may have a differential pair of transistors 82 and 84, each having a gate. The gate of a first one 82 of the differential pair of transistors is coupled to the positive output port of the differential amplifier 76, and the gate of a second one 84 of the differential pair of transistors is coupled to the negative output port of the differential amplifier circuit 76, as shown. The source terminals of the first transistor 82 and second transistor 84 of the differential pair of transistors are preferably coupled directly or indirectly to a reference voltage, such as VDD. The drain of the first transistor 82 may be coupled to the positive input signal 72. Likewise, the drain of the second transistor 84 may be coupled to the negative input signal 74. In this configuration, the control signals 78 and 80 control the offset currents supplied to the positive input signal 72 and negative input signal 74.

To create a high-pass filter, a first capacitor 90 is coupled to the first control signal 80 and a second capacitor 92 is coupled to the second control signal 78. Preferably, the first capacitor 90 and the second capacitor 92 are matched capacitors, although this is not required.

At low frequencies, the first and second capacitors 90 and 92 will appear as opens, and the feedback path from the differential amplifier 76 to the differential pair of transistors 82 and 84 will be relatively unencumbered. Accordingly, the differential pair of transistors 82 and 84 provide offset currents that force the positive input signal 72 and negative input signal 74 to be substantially equal at low frequencies. This not only provides a high-pass pole, but also actively controls (e.g., eliminates) the DC offset between the positive and negative input signals 72 and 74 of the differential input signal 70.

As the frequency increases beyond the high-pass pole, the first and second capacitors 90 and 92 begin to appear as AC shorts to ground. This effectively prevents the AC control signals from reaching the gate terminals of the differential pair of transistors 82 and 84. The differential pair of transistors may therefore provide the same offset current to the positive input signal 72 and the negative input signal 74, thereby removing the effects of the offset current at high frequencies.

It is contemplated that the first and second capacitors 90 and 92 may be any type of filter, and may include a combination of resistors, inductors (or gyrators), and/or capacitors. Using these elements, it is contemplated that the control signals 78 and 80 may be filtered using a low pass filter, a high-pass filter or a bandpass filter.

FIGS. 4A–4C are schematic diagrams showing various illustrative filter circuits that can be used in conjunction with the active controlled filters of FIGS. 1–3 to filter the control signal or signals. These are only illustrative filter circuits, and other filter circuits are contemplated. Each of the illustrative filter circuits have terminals "A" and "B", which correspond to terminals "A" and "B" of FIGS. 1–3.

FIG. 4A shows an illustrative low pass filter 100 that includes an inductor (or gyrator) 102 connected between terminals "A" and "B", and a capacitor 104 connected between terminal "B" and ground. The low pass pole of the low pass filter 100 is defined by the value of inductor 102 and capacitor 104.

FIG. 4B shows an illustrative high-pass filter 106 that includes a capacitor 108 connected between terminals "A" and "B", and an inductor (or gyrator) 110 connected between terminal "B" and ground. The high-pass pole of the high-pass filter 106 is defined by the value of capacitor 108 and inductor 110.

FIG. 4C shows an illustrative bandpass filter 120. The bandpass filter 120 includes an inductor (or gyrator) 122 in series with a capacitor 124, both connected between terminals "A" and "B". The bandpass filter 120 also includes an inductor (or gyrator) 126 in parallel with a capacitor 128, both connected between terminal "B" and ground. The low pass pole and the high-pass pole of the bandpass filter 120 are defined by the values of inductors 122 and 126 and capacitors 124 and 128.

Figure 5:
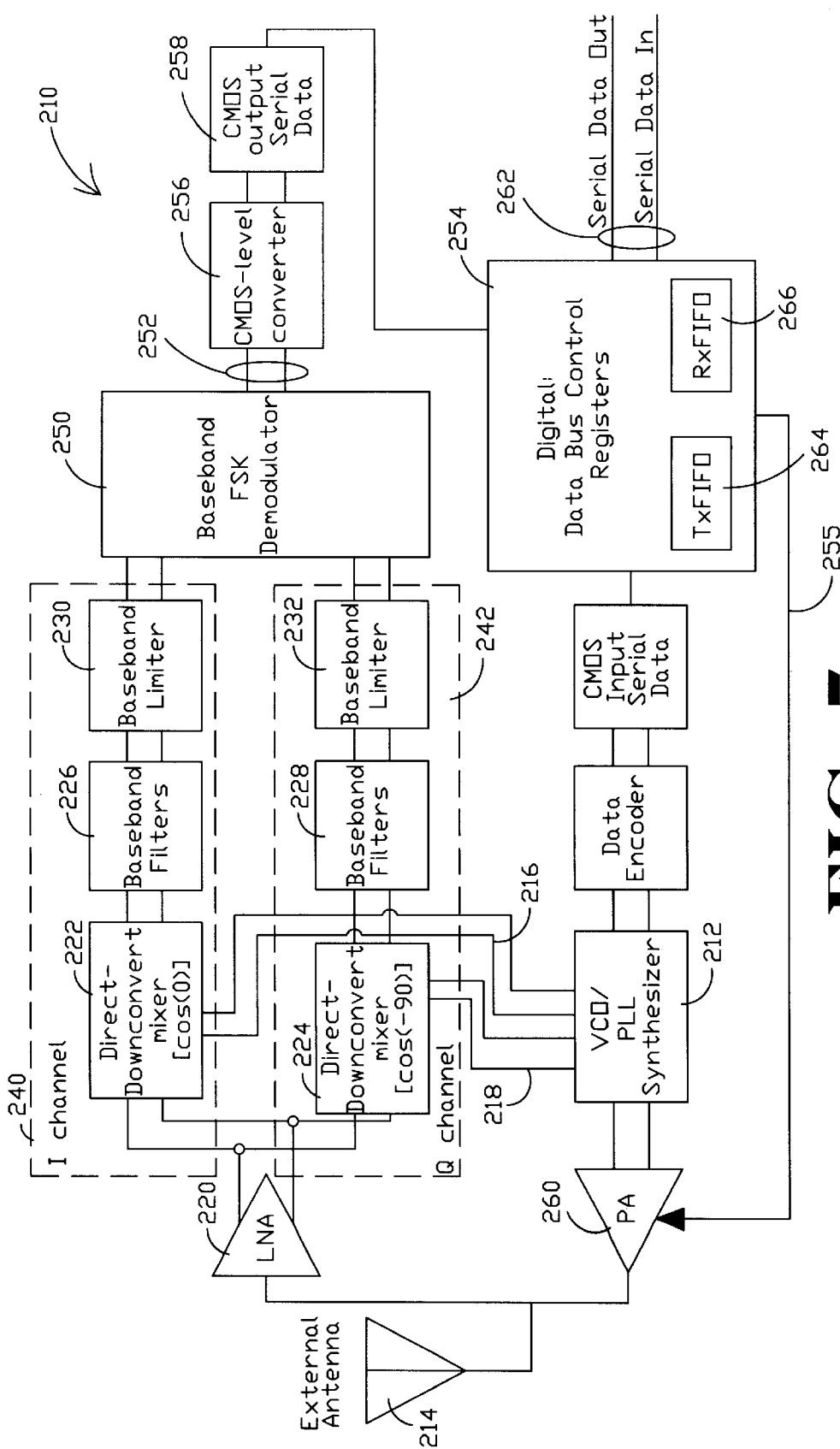
FIG. 5 is a block diagram of an integrated Direct Down Conversion Narrowband FSK Transceiver incorporating the present invention.

FIG. 5 is a block diagram of an integrated direct down conversion Narrowband FSK Transceiver 210 that incorporates the present invention. The Narrowband FSK Transceiver 210 includes both transmit and receive functions, preferably on a single substrate with minimal use of external components. In use, the Narrowband FSK Transceiver 210 provides a half-duplex transceiver radio data link capable of statistical frequency-spread transmissions.

Two or more Narrowband Transceivers 210 can be used to form a wireless data communication network. Because each Narrowband FSK Transceiver 210 includes both transmit and receive functions, bi-directional transmission is possible. Bi-directional transmission allows data transfers to be confirmed, thereby increasing the reliability of the link to near 100 percent, depending on the access control algorithm implemented by the user.

The basic architecture of the Narrowband FSK Transceiver 210 is shown in FIG. 5. Off-chip components may include a crystal (which can be shared with an applications microprocessor), front end LC matching and filtering components, LC circuits for tuning the Phase Lock Loop (PLL)/Voltage Controlled Oscillator (VCO) 212, some external capacitors for filtering supply noise, a printed circuit board (PCB), an antenna 214 and a power source. The single chip Narrowband FSK Transceiver 210 is intended for the 418 MHz, 434.92 MHz, 868–870 MHz, and 902–928 MHz frequency bands.

The receiver design is based on the direct down conversion principle which mixes the input signal directly down to the baseband using a local oscillator at the carrier frequency. The direct down conversion principle is discussed in "Design Considerations for Direct-Conversion Receivers", by Behzad Rasavi, *IEEE Transactions On Circuits and Systems—II, Analog and Digital Signal Processing*. Vol. 44, No. 6, June 1997. In a direct down conversion algorithm, two complete signal paths are provided including an I-channel 240 and a Q-channel 242, where the Q-channel 242 has a 90 degree phase shift relative to the I-channel 240. The I-channel 240 and the Q-channel 242 are used to demodulate the received signal.

Accordingly, the received signal is first provided to a low noise amplifier (LNA) 220. The LNA 220 preferably includes a compensation circuit that actively compensates selected bias levels within the LNA 220 in response to variations in the supply voltage, as more fully described in U.S. patent application Ser. No. 09/311,234, filed May 13, 1999, entitled "Compensation Mechanism For Compensating Bias Levels Of An Operation Circuit In Response To Supply Voltage Changes", which has been incorporated herein by reference. LNA 220 differentially drives a quadrature mixer pair 222 and 224. As indicated above, the input signal provided to mixer 224 is phase shifted 90 degrees relative to the input signal provided to mixer 222.

The PLL synthesizer/(VCO) 212 provides local oscillator (LO) signals in phase quadrature to mixers 222 and 224 via interfaces 216 and 218, respectively. Mixer 222 mixes the non-phase shifted LO signal with the input signal, while Mixer 224 mixes the 90 degree phase shifted LO signal with the same input signal. In accordance with the present invention, mixers 222 and 224 also preferably include a compensation circuit that actively compensates selected bias levels in response to variations in supply voltage, as more fully described in U.S. patent application Ser. No. 09/311,234, filed May 13, 1999, entitled "Compensation Mechanism For Compensating Bias Levels Of An Operation Circuit In Response To Supply Voltage Changes", which has been incorporated herein by reference.

The differential outputs of mixer 222 and mixer 224 are provided down two identical signal channels in quadrature phase: the I-channel 240 and the Q-channel 242. I-channel 240 includes baseband filter block 226, and Q-channel 242 includes baseband filter block 228. Each baseband filter block may include a single pole low pass filter, followed by a second order filter (with two near-DC high-pass poles and two wideband low-pass poles), and a gyrator filter. The main channel filter of each baseband filter block is the gyrator filter, which preferably includes a gyrator-capacitor implementation of a 7-pole elliptic low-pass filter. A preferred 7-pole elliptic low-pass filter is described in U.S. patent application Ser. No. 09/311,234, file May 13, 1999, entitled "Differential Filter with Gyrator". The elliptic filter minimizes the total capacitance required for a given selectivity and dynamic range. In a preferred embodiment, the low-pass gyrator cut-off frequency can be adjusted by an external resistor.

I-channel 240 may also include limiter block 230, and Q-channel 42 may include limiter block 232. Limiter blocks 230 and 232 preferably limit the amplitudes of the corresponding signals to remove the amplitude information before the signals are provided to the demodulator 250. At least one of the limiter blocks 230 and 232 may contain an RSSI (Receive Signal Strength Indicator) output that can be used for Forward-and-Reverse link power management for DSSS applications or for demodulating ASK (Amplitude Shift Key) or OOK (On Off Key) signals. One such power management approach is described in U.S. patent application Ser. No. 09/311,250, filed May 13, 1999, entitled "Wireless System With Variable Learned-In Transmit Power". The RSSI signal may also be used by AFC (Automatic Frequency Control frequency tracking) or AGC (Automatic Gain Control dynamic range enhancement), or both.

The demodulator 250 combines and demodulates the I- and Q-channel outputs to produce a digital data output 252. In doing so, the demodulator 250 detects the relative phase difference between the I- and Q-channel signals. If the I-channel signal leads the Q-channel signal, the FSK tone frequency lies above the tone frequency, indicating a data '1' state. If the I-channel signal lags the Q-channel signal, the FSK tone frequency lies below the tone frequency, indicating a data '0' state. The digitized output 252 of the receiver is provided to Control block 254 via CMOS-level converter 256 and CMOS Output Serial Data block 258.

The transmitter of the Narrowband FSK Transceiver 210 includes a PLL frequency synthesizer and a power amplifier 260. A preferred implementation of power amplifier 260 is shown and described in co-pending U.S. patent application Ser. No. 09/311,242 filed May 13, 1999, entitled "Output Buffer With Independently Controllable Current Mirror Legs". The frequency synthesizer may include a voltage-controlled oscillator (VCO) 212, a crystal oscillator, a prescaler, a number of programmable frequency dividers, and a phase detector. A loop filter may also be provided external to the chip for flexibility, which may be a simple passive circuit. The VCO 212 preferably provides one or more on-chip varactors. In one embodiment, the VCO 212 includes a high tune sensitivity varactor for wideband modulation and a low tune sensitivity varactor for narrowband modulation. The modulation varactor that is chosen depends on the particular application. The modulation varactors are used to modulate a serial data stream onto a selected carrier frequency. The modulated signal is provided to the power amplifier 260, which drives the external antenna 214.

Preferably, the output power level of the power amplifier 260 can be controlled by Control block 254 via interface 255. This allows a transmitting Narrowband FSK Transceiver 210 to transmit a signal at a relatively low power level to conserve system power. If an acknowledge is received from a receiving Narrowband FSK Transceiver, the transmission is complete. If an acknowledge is not received, however, the transmitting Narrowband FSK Transceiver may increase the power level of the power amplifier 260. If an acknowledge is still not received from a receiving Narrowband FSK Transceiver, the transmitting Narrowband FSK Transceiver may again increase the power level of the power amplifier 260. This may be repeated until an acknowledge is received, or the maximum power level of the power amplifier 260 is reached. A further discussion of this and other power management algorithms are described in co-pending U.S. patent application Ser. No. 09/311,250 filed May 13, 1999, entitled "Wireless System With Variable Learned-In Transmit Power".

A four-pin Serial Peripheral Interface (SPI) bus 262 is used to program the internal configuration registers of the control block 254, and access the transmit (Tx) FIFO 264 and the receive (Rx) FIFO 266. During a transmit operation, data bytes are written to the Tx FIFO 264 over the SPI bus 262. The controller block 254 reads the data from the Tx FIFO 264, and shifts the data serially with the addition of Start and Stop bits to VCO 212 for modulation. As indicated above, VCO 212 then provides the modulated signal to power amplifier 260, which drives the external antenna 214.

During a receive operation, the received signal is provided to LNA 220, down I-channel 240 and Q-channel 242 as described above, and finally to demodulator 250. The demodulated signal is then over-sampled to detect the Start and Stop bits for synchronization. After a complete byte is serially collected, including the corresponding Start and Stop bits, the byte is transferred to the Rx FIFO 266. The Controller block 254 senses when the Rx FIFO 266 has data, and sends an SPI interrupt signal on SPI bus 262, indicating that the Rx FIFO 266 is ready to be read by an external processor or the like (not shown).

Figure 6:
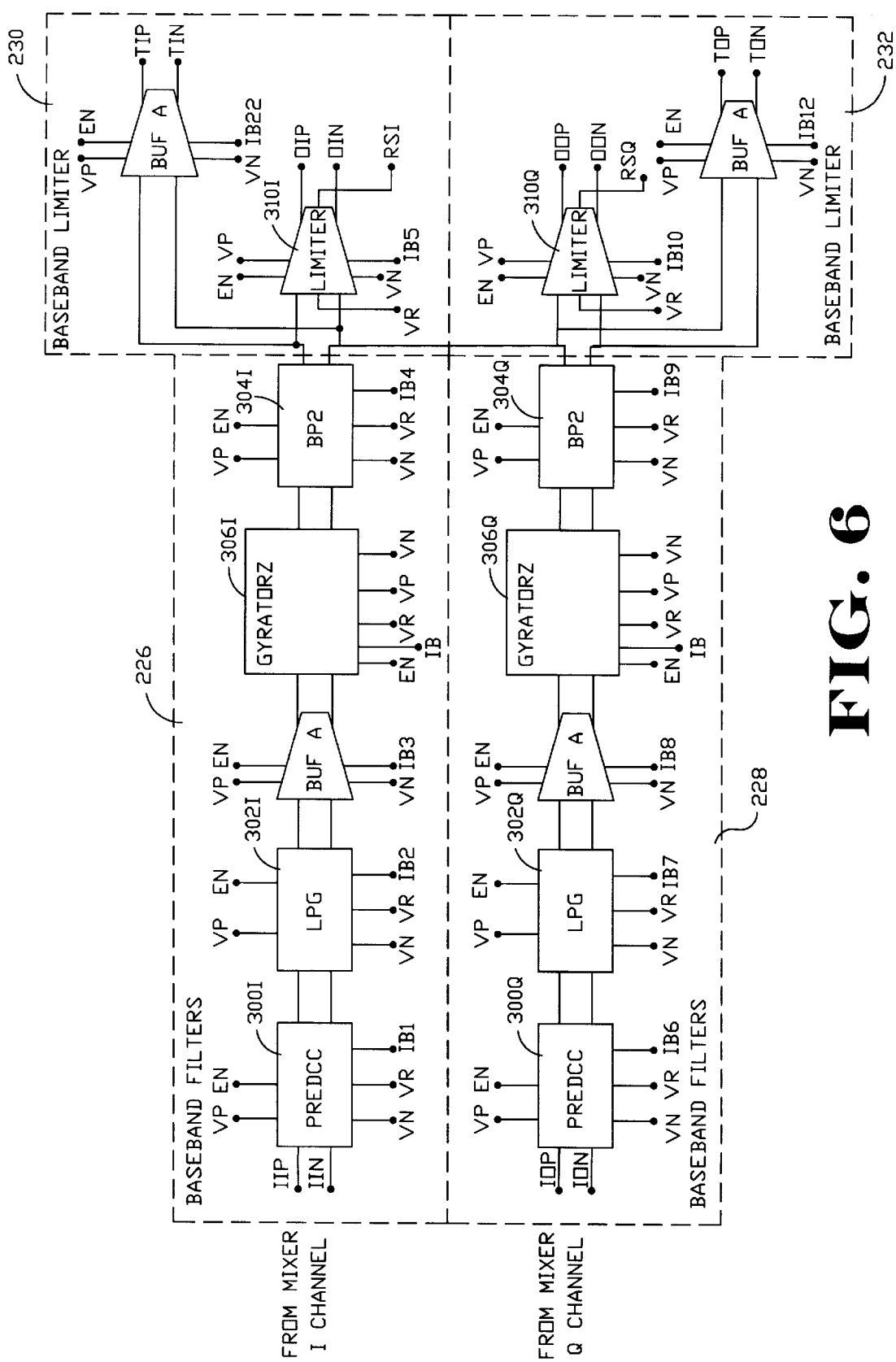
FIG. 6 is a block diagram of the baseband filters and baseband limiter blocks of FIG. 5.

FIG. 6 is a block diagram of the baseband filter block and baseband limiter block used in the I and Q channels of FIG. 5. As indicated above, the differential outputs of mixer 222 and mixer 224 of FIG. 5 are provided to two identical signal channels in quadrature phase, including I-channel 240 and the Q-channel 242. The I-channel 240 includes baseband filter block 226, followed by baseband limiter block 230. The Q-channel 242 includes baseband filter block 228, followed by baseband limiter block 232.

Referring now specifically to FIG. 6, each baseband filter block 226 and 228 includes a single pole low pass filter, a second order filter (with two near-DC high-pass poles and two wideband low-pass poles), and a gyrator filter. The PREDCC blocks 300I and 300Q include one of the near-DC high-pass poles and one of the wideband low pass poles of the second order filter. The LPG (Low Pass Gain) stages 302I and 302Q include the single pole low pass filter. The BP2 (Band Pass 2) stages 304I and 304Q include the other of the near-DC high-pass poles and the other of the wideband low pass poles of the second order filter. Finally, the GYRATORZ blocks 306I and 306Q include a differential gyrator-capacitor implementation of a 7-pole elliptic low-pass filter. A preferred 7-pole elliptic low-pass filter is described in U.S. patent application Ser. No. 09/311,105 filed May 13, 1999, entitled "Differential Filter with Gyrator".

Limiter blocks 230 and 232 preferably limit the amplitudes of the corresponding signals to remove the amplitude information before the signals are provided to the demodulator 250 of FIG. 5. Baseband limiter 230 includes differential limiter 310I, and baseband limiter 232 includes differential limiter 310Q. BUFA blocks 312I, 312Q, 314I and 314Q buffer the corresponding intermediate differential signals.

It is contemplated that the gain through the baseband filter blocks 226 and 228 and the Limiter Blocks 230 and 232 may exceed 1,000. In such high gain applications, it is often desirable to remove any DC offset from the differential input signal prior to amplification. In the present invention, the PREDCC blocks 300I and 300Q, the BP2 blocks 304I and 304Q, and the LIMITER blocks 310I and 310Q each include a DC offset cancellation circuit in accordance with the present invention. The DC offset cancellation circuit both actively provides a near-DC high-pass pole, and actively cancels out the DC offset before sending the signal to the next succeeding stage. This is desirable to prevent large out of band signals, such as DC offsets, from suppressing the wanted low level in-band signals.

Figure 7:
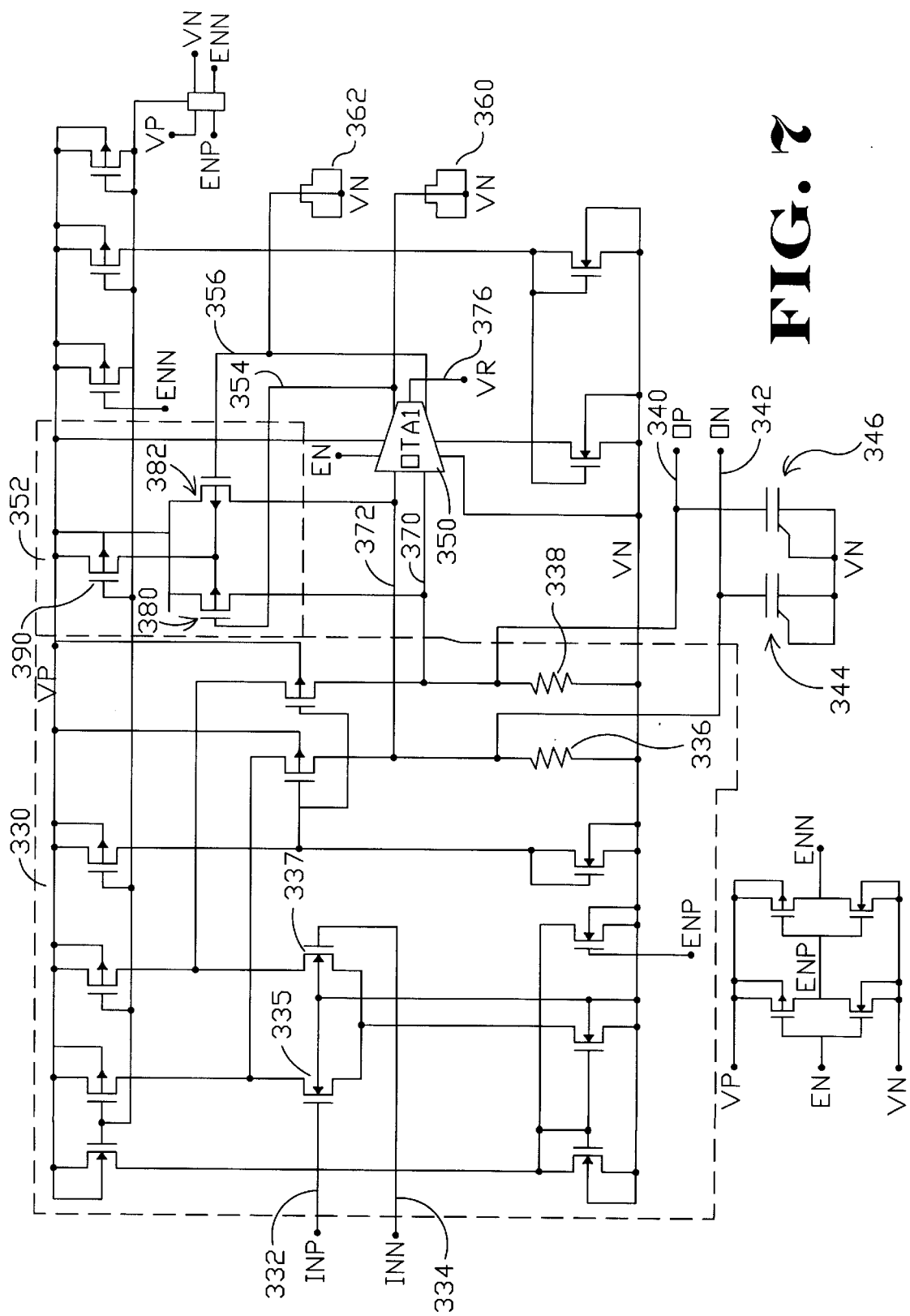
FIG. 7 is a schematic diagram of the PREDCC block of FIG. 6.

FIG. 7 is a schematic diagram of one of the PREDCC blocks of FIG. 6. The differential input signal is provided to a folded cascode input stage 330. The folded cascode input stage converts the differential input voltage on input terminals 332 and 334 into a differential current through load resistors 336 and 338. The gain of the input stage is determined by the value of the load resistors 336 and 338. The differential current through load resistors 336 and 338 produces a differential output voltage on output terminal 340 and 342. The input pair 335 and 337 of the folded cascode amplifier also provide "hyperbolic limiting" to help prevent the input stage 330 from becoming saturated when large input signals are provided by the mixer.

Capacitors 344 and 346 provide a wide-band low pass pole. The value of capacitors 344 and 346 determine the cut-off frequency of the low pass pole. The low pass pole provided by capacitors 344 and 346, the out of band signals are rejected before they are amplified.

To provide a near-DC high-pass pole (and DC offset rejection), differential amplifier 350 and offset circuit 352 are provided. The differential amplifier 350 samples the output of the folded cascode input stage 330, and provides differential control signals 354 and 356 to the offset circuit 352 as shown. The offset circuit 352 accepts the differential control signals 354 and 356, and provides enough current to the load resistors 336 and 338 to compensate for (i.e., zero out) the DC offset voltage at the input of the differential amplifier 350.

Load capacitors 360 and 362 are connected to each of the differential control signals 354 and 356. At low frequencies, the load capacitors 360 and 362 appear as opens, and the feedback path from the differential amplifier 350 to the offset circuit 352 remains relatively unencumbered. Thus, control signals 354 and 356 cause offset circuit 352 to provide offset currents that force the positive input port 370 and the negative input port 372 of the differential amplifier 350 to be substantially equal. As indicated above, this not only actively controls (e.g., eliminates) the DC offset between the positive and negative input ports 370 and 372, but also provides a high-pass pole.

As the frequency increases beyond the high-pass pole, the load capacitors 360 and 362 begin to appear as AC shorts to ground. This effectively prevents the AC control signals from reaching the offset circuit 352, and the offset circuit 352 provides the same offset current to the positive input port 370 and the negative input port 372. When this occurs, the differential amplifier 350 may provide a sufficient DC voltage to the offset circuit 352 so that the positive input port 370 and the negative input port 372 are centered about a reference voltage, such as reference voltage 376.

The offset circuit preferably includes a differential pair of transistors 380 and 382. The gate of differential transistor 380 is preferably connected to the positive output port 354 of the differential amplifier 350, and the gate of differential transistor 382 is preferably coupled to the negative output port 356 of the differential amplifier 350. The source terminals of the first and second differential transistors 380 and 382 are preferably coupled indirectly to VDD through a current mirror transistor 390. The drain of differential transistor 380 is preferably coupled to the positive input port 370 of the differential amplifier 350. The drain of differential transistor 382 is preferably coupled to the negative input port 372 of the differential amplifier 350. In this configuration, the differential control signals 354 and 356 control the offset currents provided by differential transistors 380 and 382 to the positive input port 370 and negative input port 372 of the differential amplifier 350.

Figure 8:
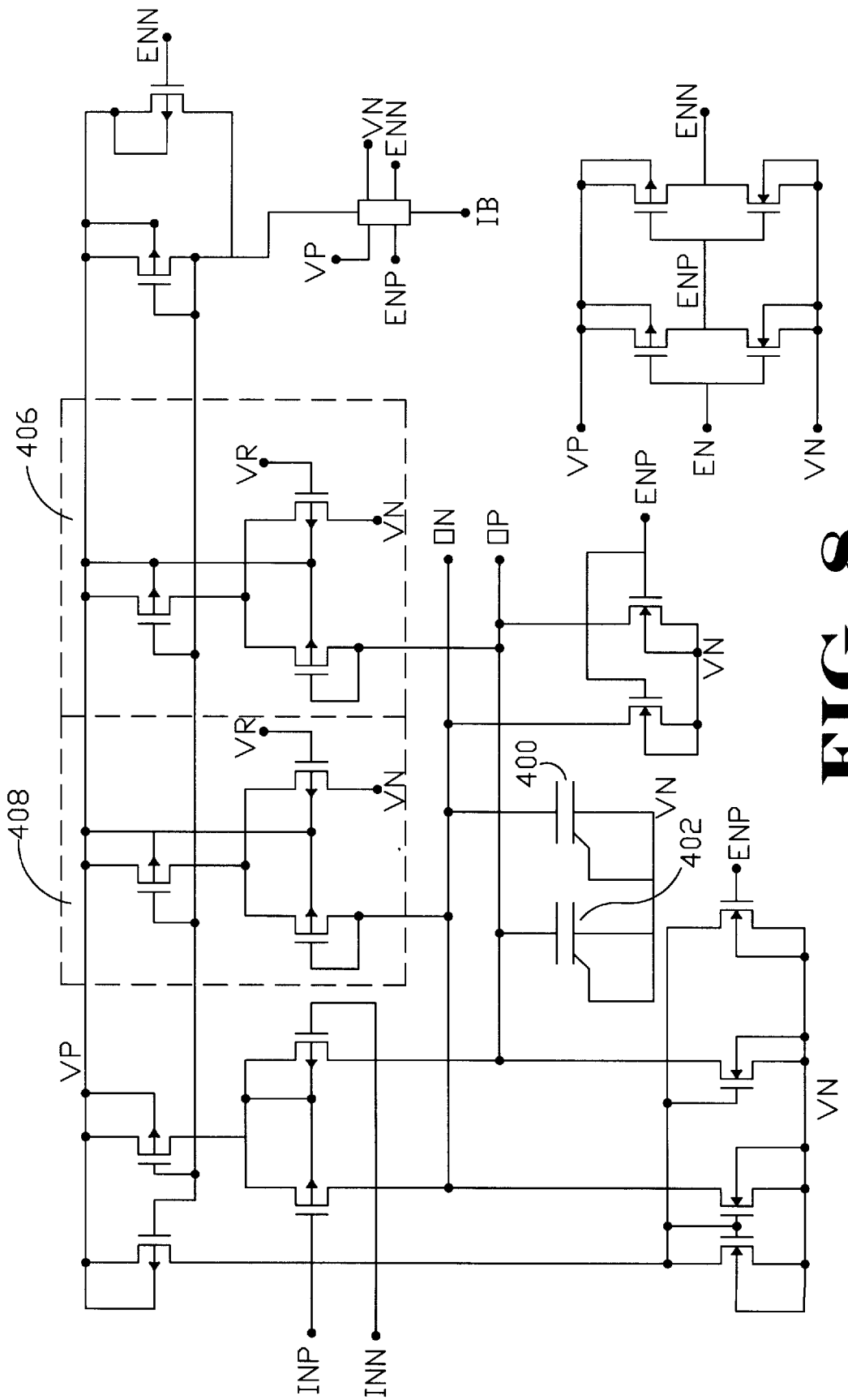
FIG. 8 is a schematic diagram of the LPG block of FIG. 6.

FIG. 8 is a schematic diagram of the LPG blocks of FIG. 6. The LPG blocks 302I and 302Q amplify the signal and provide a low pass pole. The LPG blocks 302I and 302Q are placed after the PREDCC blocks 300I and 300Q to maximize the dynamic range of the channel since the out of band signals will already have been rejected by the low and high-pass poles of the PREDCC blocks 300I and 300Q.

The impedance level of the LPG blocks 302I and 302Q are preferably higher than the PREDCC blocks 300I and 300Q. This helps reduce the capacitance values required to obtain the desired low pass pole formed by capacitors 400 and 402, thereby reducing the area (cost) of the integrated circuit. The impedance level of the LPG blocks 302I and 302Q is raised by using linear transconductor loads 406 and 408, instead of polysilicon resistor loads 336 and 338 as shown in FIG. 7. The linear transconductor loads 406 and 408 can produce larger impedance levels in a smaller area than polysilicon resistors. Further, because the signal is now larger, the need for a linear load increases.

Figure 9:
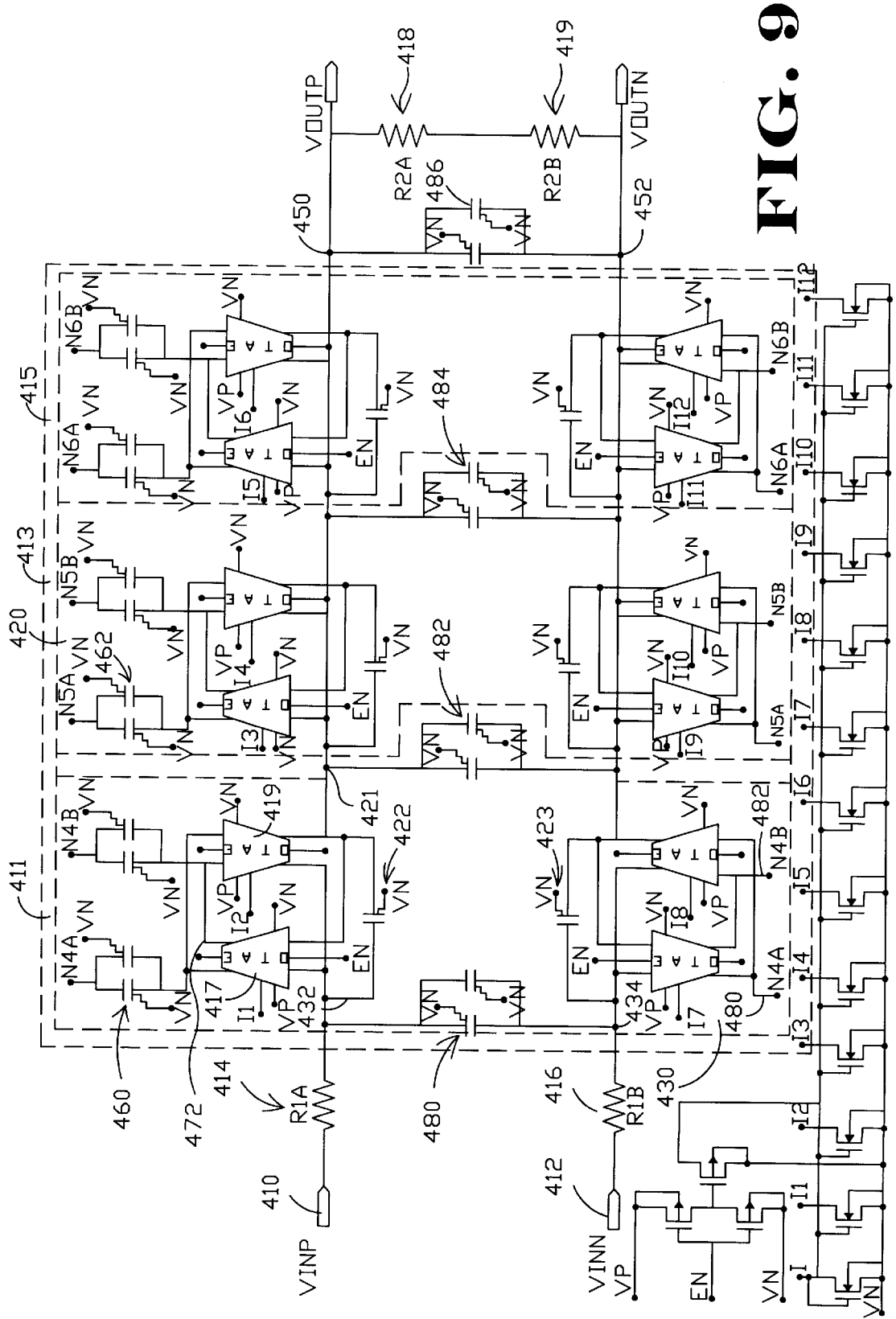
FIG. 9 is a schematic diagram of GYRATORZ block of FIG. 6.

FIG. 9 is a schematic diagram of the GYRATORZ blocks of FIG. 6. The GYRATORZ blocks 306I and 306Q prefer- ably provide a differential gyrator-capacitor implementation of a 7-pole elliptic low-pass filter. A preferred differential gyrator based 7-pole elliptic low-pass filter is described in U.S. patent application Ser. No. 09/311,105 filed May 13, 1999, entitled "Differential Filter with Gyrator", which is incorporated herein by reference.

Briefly, the differential gyrator based 7-pole elliptic low-pass filter is adapted to receive a differential input signal on terminals 410 and 412. Input resistors 414 and 416 provide a desired input impedance, and output resistors 418 and 419 provide a desired output impedance. Each of the gyrator circuits, such as gyrator circuit 420, simulates the behavior of an inductor. Therefore, in one gyrator stage, gyrator circuit 420 and capacitor 422 form a parallel LC network, and a gyrator circuit 430 and capacitor 423 form another paralleled LC network. A cross-capacitor 424 is connected between the input terminal 432 of gyrator circuit 420 and the input terminal 434 of gyrator circuit 430.

The above-described gyrator stage is then duplicated two times and connected in a cascade configuration as shown to form the differential gyrator based 7-pole elliptic low-pass filter. A final cross-capacitor is coupled between the output terminals 450 and 452 of the filter.

To help minimize the capacitor area, the load capacitors for each gyrator stage are preferably shared between the positive and negative inputs paths. For example, the load capacitors 460 and 462 are preferably connected between the load terminals 470 and 472 of the gyrator circuit 420 and the load terminals 480 and 482 of corresponding gyrator circuit 430. This minimizes the total load capacitance required for the differential gyrator based filter, at least relative to a configuration where two sets of capacitors are provided, are for each gyrator circuit. Likewise, the cross-capacitors 480, 482, 486 and 488 are preferably shared between the positive and negative inputs paths. This also reduces the total capacitance required to implement the differential gyrator based filter. By reducing the total capacitance, the overall density, reliability, and yield of the filter may be improved.

Figure 10:
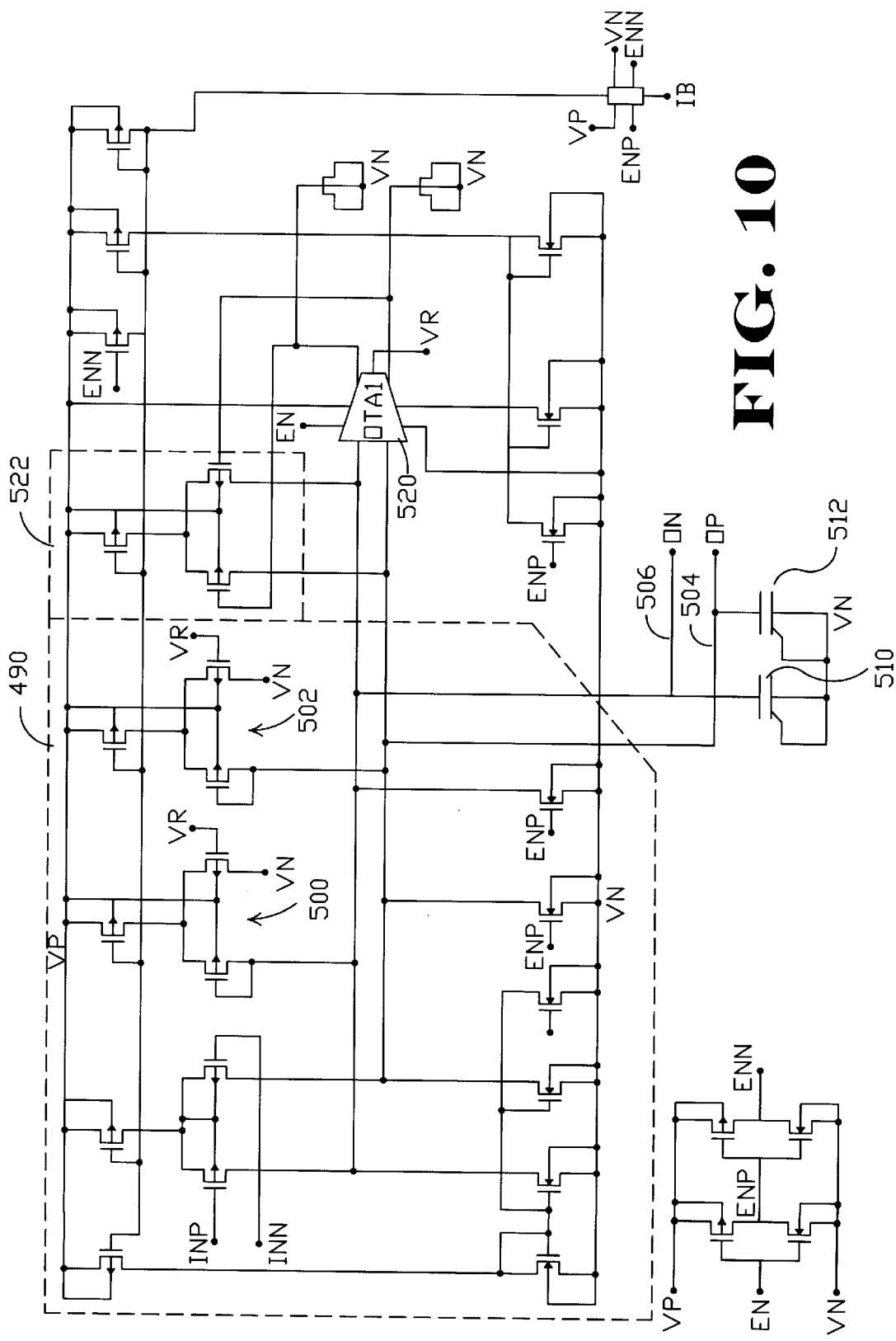
FIG. 10 is a schematic diagram of the BP2 block of FIG. 6.

FIG. 10 is a schematic diagram of the BP2 blocks of FIG. 6. The BP2 blocks 304I and 304Q are similar to the PREDCC blocks 300I and 300Q of FIG. 7. Each of the BP2 blocks 304I and 304Q have a folded cascode input stage 490 that amplifies the input signal. The gain of the input stage is primarily determined by the value of the linear transconductor loads 500 and 502. As indicated above, the linear transconductor loads 500 and 502 can produce larger impedance levels in a smaller area than polysilicon resistors. The differential current through linear transconductor loads 500 and 502 produces a differential output voltage on output terminals 504 and 506.

Capacitors 510 and 512 provide a wide-band low pass pole. The differential amplifier 520 and offset circuit 522 provide a near-DC high-pass pole and DC offset rejection, as further described above with reference to FIG. 7.

Figure 11:
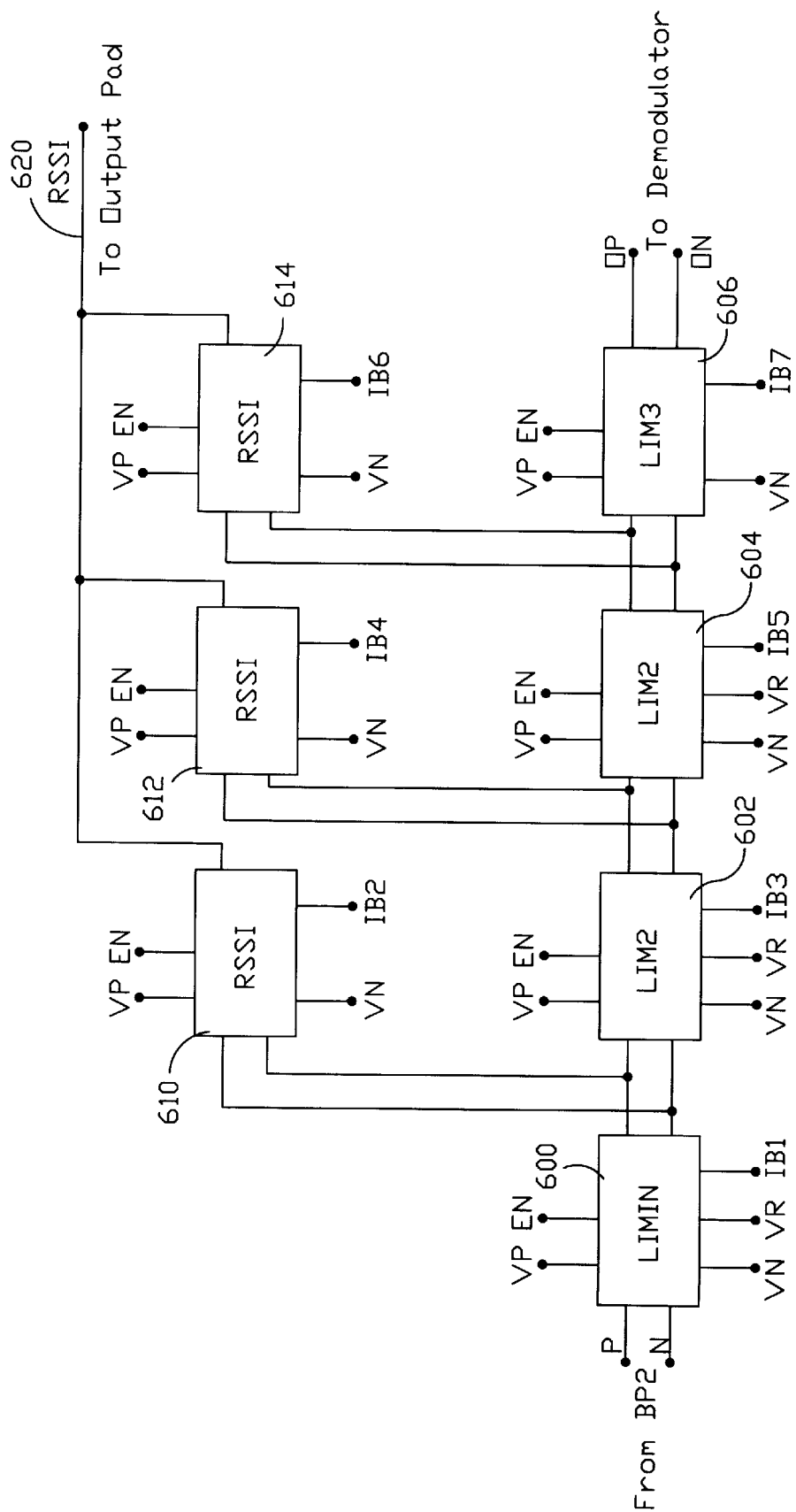
FIG. 11 is a schematic diagram of the LIMITER block of FIG. 6.

FIG. 11 is a schematic diagram of one of the Limiter blocks 230 and 232 of FIG. 6. The limiter blocks 230 and 232 each include a number of cascaded amplifier stages including LIMIN 600, LIM2 602, LIM2 604 and LIM3 606. Each amplifier stage amplifies the signal provided by the previous amplifier stage.

At least one of the limiter blocks 230 and 232 preferably contains an RSSI (Receive Signal Strength Indicator) output that can be used for Forward-and-Reverse link power management for DSSS applications or for demodulating ASK (Amplitude Shift Key) or OOK (On Off Key) signals. One such power management approach is described in U.S. patent application Ser. No. 09/311,250 filed May 13, 1999, entitled "Wireless System With Variable Learned-In Transmit Power". The RSSI signal may also be used by AFC (Automatic Frequency Control frequency tracking) or AGC (Automatic Gain Control dynamic range enhancement), or both.

To generate the RSSI signal, an RSSI block may be connected to the output of each amplifier stage 600, 602 and 604 as shown. Each RSSI block provides an output signal that is proportional to the amplitude of the corresponding amplified input signal until the corresponding RSSI block becomes saturated, whereupon a relatively constant output signal is provided to the RSSI output signal 620.

The amplitude at the output terminals of the LIM2 stage 604 will normally be larger than the amplitude at the output terminals of the LIM2 stage 602. Likewise, the amplitude at the output terminals of the LIM2 stage 602 will normally be larger than the amplitude at the output terminals of the LIMIN stage 600. Therefore, the LIM2 stage 604 will likely be the first amplifier stage to significantly contribute to the RSSI output signal 620.

As the input signal to the LIMIN stage 600 increases in amplitude, the LIM2 stage 604 will eventually become saturated, and the LIM2 stage 602 will begin to significantly contribute to the RSSI output signal 620. Finally, as the input signal to the LIMIN stage 600 even further increases in amplitude, the LIM2 stage 602 will become saturated, and the LIMIN stage 600 will begin to significantly contribute to the RSSI output signal 620. This configuration allows the RSSI output signal 620 to provide a Receive Signal Strength Indicator over a wide range of signal strength values.

Figure 12:
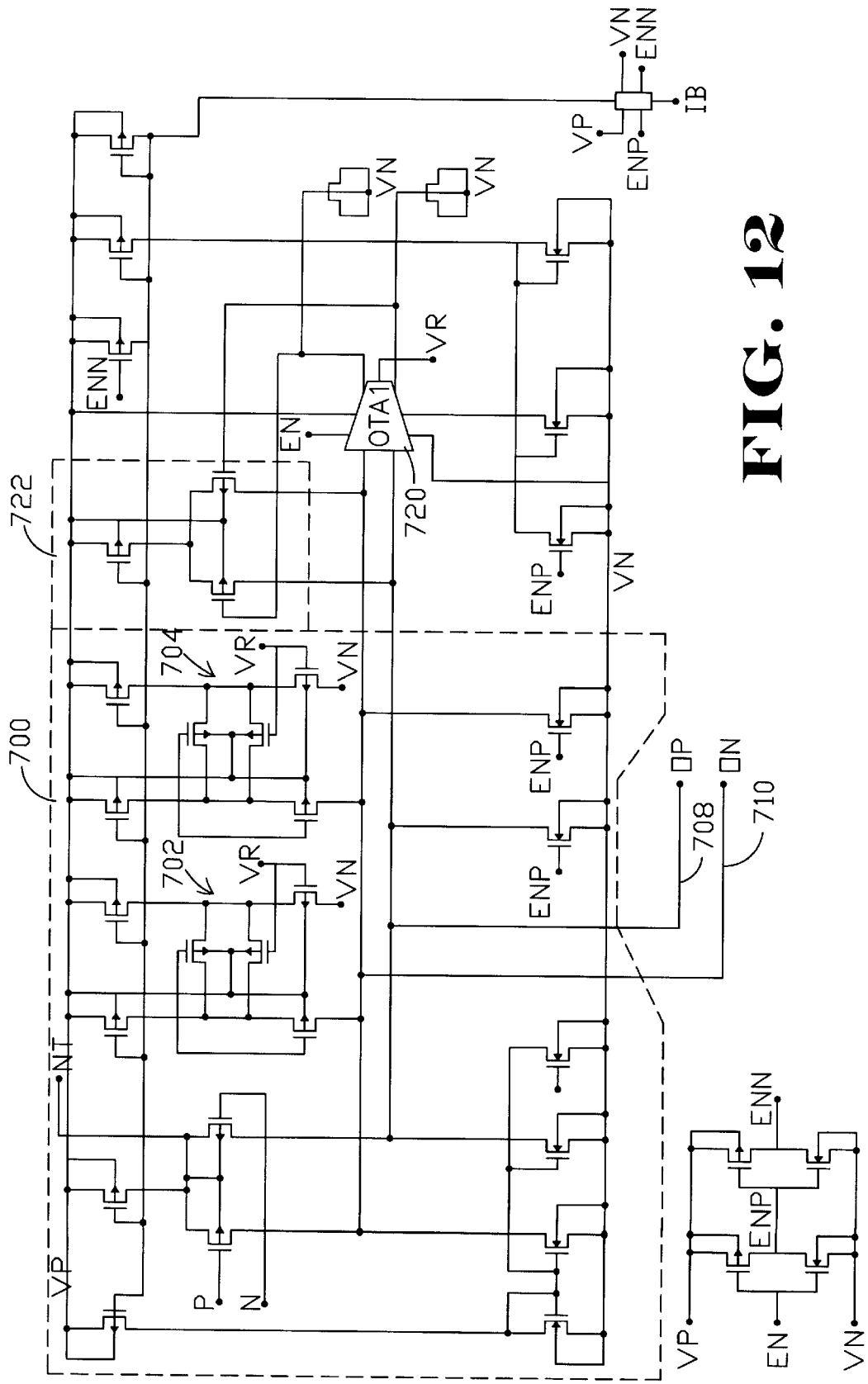
FIG. 12 is a schematic diagram of the LIMIN block of FIG. 11.

FIG. 12 is a schematic diagram of the LIMIN block of FIG. 11. The LIMIN block is similar to the PREDCC block of FIG. 7, and the BP2 block of FIG. 10. The LIMIN block 600 has a folded cascode input stage 700 that amplifies the input signal. The gain of the input stage 700 is determined by the value of the linear transconductor loads 702 and 704. The differential current through linear transconductor loads 702 and 704 produces a differential output voltage on output terminal 708 and 710. Differential amplifier 720 and offset circuit 722 provide a near-DC high-pass pole and DC offset rejection, as further described above with reference to FIG. 7 and FIG. 10.

Figure 13:
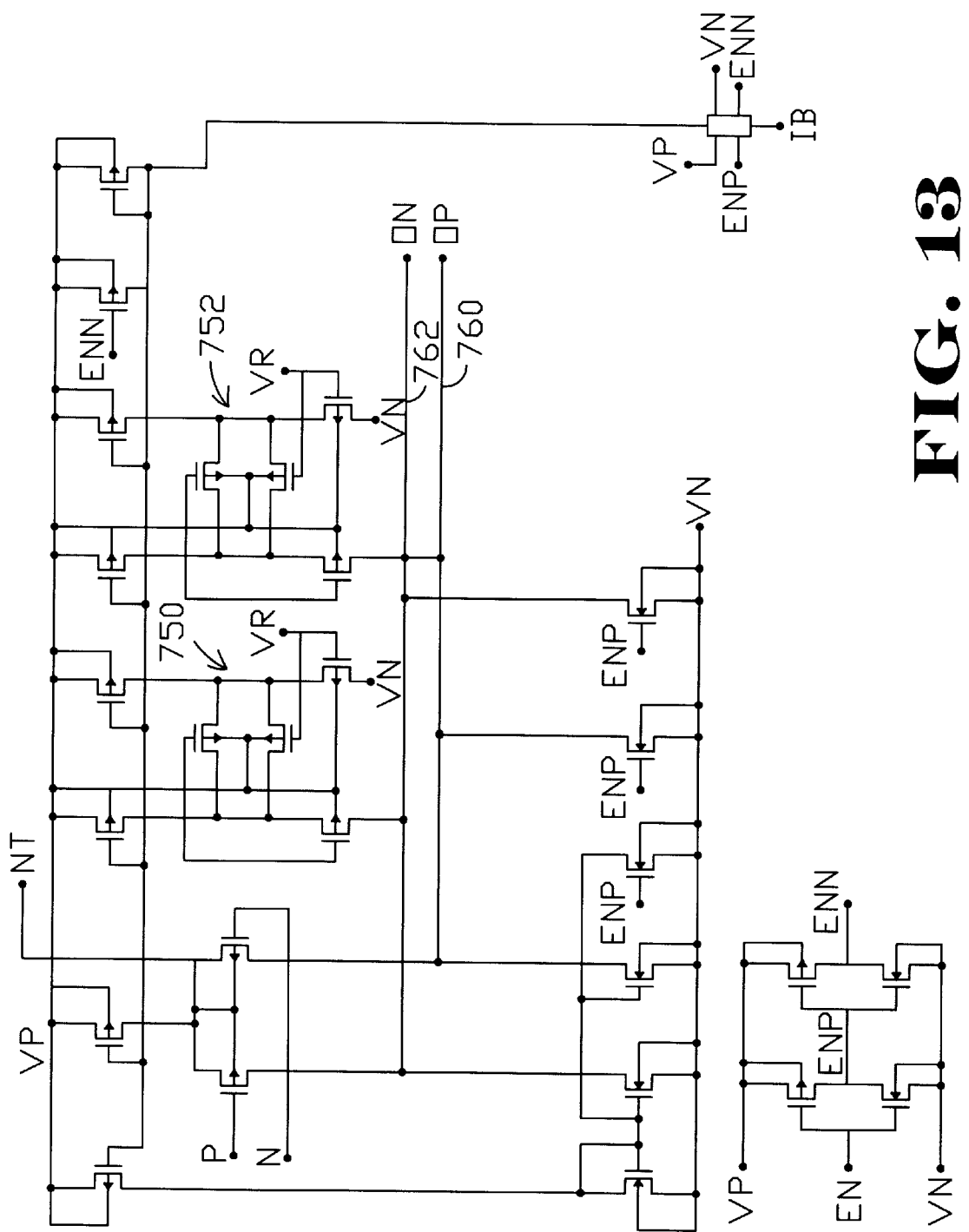
FIG. 13 is a schematic diagram of the LIM2 block of FIG. 11.

FIG. 13 is a schematic diagram of the LIM2 blocks 602 and 604 of FIG. 11. The LIM2 block has a folded cascode input stage that amplifies the input signal. The gain of the input stage is determined by the value of the linear transconductor loads 750 and 752. The differential current through linear transconductor loads 750 and 752 produces a differential output voltage on output terminals 760 and 762.

Figure 14:
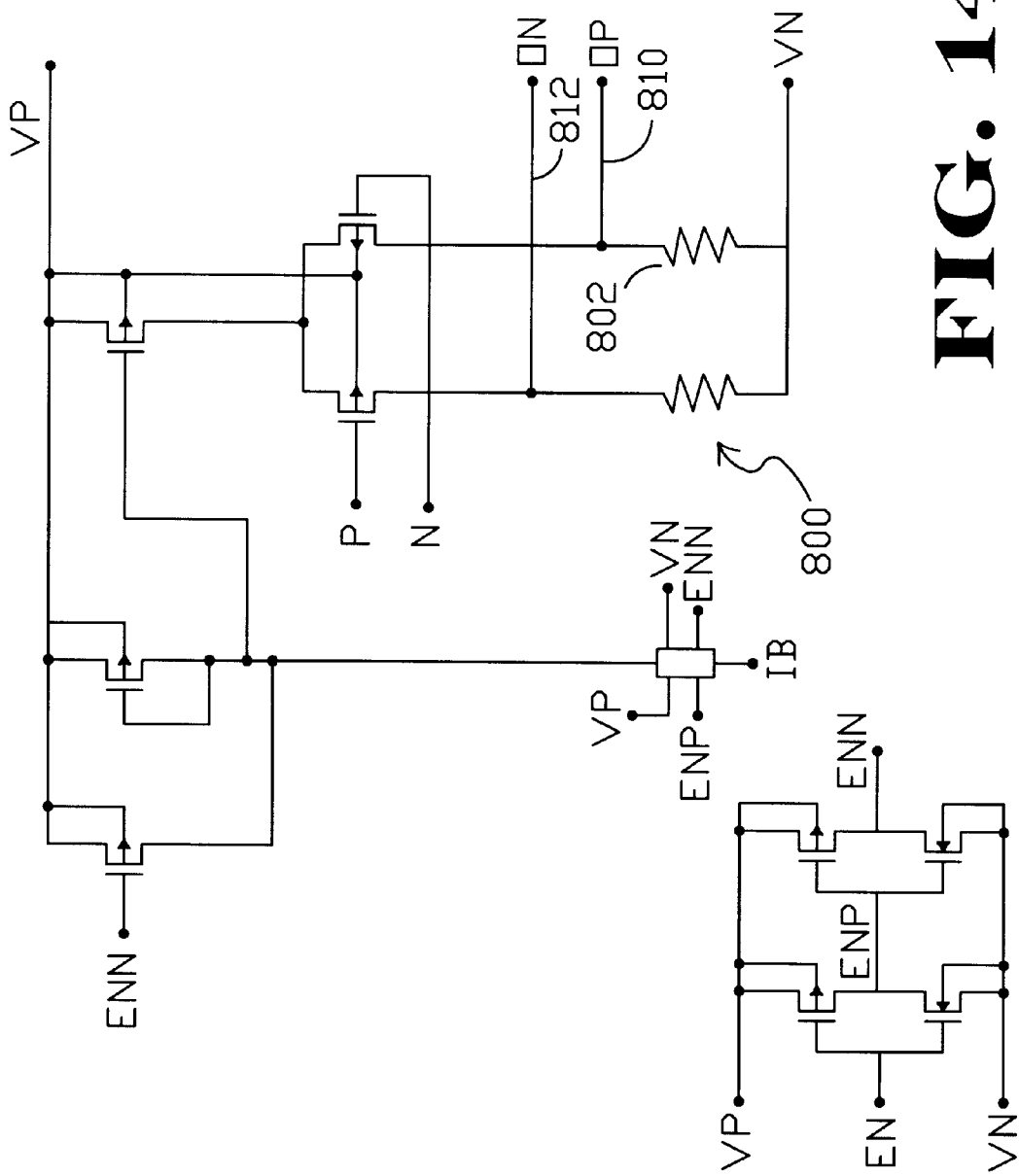
FIG. 14 is a schematic diagram of the LIM3 block of FIG. 11.

FIG. 14 is a schematic diagram of the LIM3 block 606 of FIG. 11. The LIM3 block 606 also has a differential input stage that directly amplifies the input signal. The gain of the input stage is determined by the value of the resistors 800 and 802. The differential current through resistors 800 and 802 produces a differential output voltage on output terminals 810 and 812.

Having thus described the preferred embodiments of the present invention, those of skill in the art will readily appreciate that the teachings found herein may be applied to yet other embodiments within the scope of the claims hereto attached.

What is claimed is:

1. In a filter for filtering selected frequencies from a differential input signal wherein the differential input signal has a positive input signal and a negative input signal, the filter effectively removing a first frequency from the differential input signal while effectively passing a second frequency, the filter having a positive input terminal for receiving the positive input signal of the differential input signal and a negative input terminal for receiving the negative input signal of the differential input signal, wherein the improvement comprises:

comparing means for comparing the positive input signal and the negative input signal, and providing a control signal that is related to the difference between the positive input signal and the negative input signal;

filter means for filtering the control signal, said filtering means substantially preventing the control signal from tracking the difference between the positive input signal and the negative input signal at the second frequency, while substantially allowing the control signal to track the difference between the positive input signal and the negative input signal at the first frequency, said filter means including matched capacitors; and offset means for receiving the control signal and for providing one or more offset signals to the positive input terminal and the negative input terminal of the filter, the one or more offset signals effectively removing the difference between the positive input signal and the negative input signal of the differential input signal at the first frequency, and not substantially affecting the difference between the positive input signal and the negative input signal of the differential input signal at the second frequency, the first frequency being higher than the second frequency.

2. A filter according to claim 1, wherein the one or more offset signals cause both the positive input signal and the negative input signal to have a predetermined DC reference voltage component at the first frequency.

3. A filter according to claim 1, wherein said comparing means comprises a differential amplifier circuit having a positive input port, a negative input port, a positive output port and a negative output port, the positive input port is coupled to the positive input terminal of the filter, and the negative input port is coupled to the negative input terminal of the filter.

4. A filter according to claim 3, wherein said offset means comprises a differential pair of transistors each having a gate, the gate of a first one of the differential pair of transistors is coupled to the positive output port of the differential amplifier circuit, and the gate of a second one of the differential pair of transistors is coupled to the negative output port of the differential amplifier circuit.

5. A filter according to claim 4, wherein said filter means includes a first filter having one of the matched capacitors coupled to the positive output port of the differential amplifier circuit.

6. A filter according to claim 5, wherein said filter means further includes a second filter having another one of the matched capacitors coupled to the negative output port of the differential amplifier circuit.

7. A filter according to claim 5 wherein said first filter includes an inductance element.

8. A filter according to claim 5 wherein said first filter includes a resistance element.

9. A filter according to claim 6 wherein said first filter and said second filter provide the same impedance.

10. In a filter for filtering selected frequencies from a differential input signal wherein the differential input signal has a positive input signal and a negative input signal, the filter effectively removing a first frequency from the differential input signal while effectively passing a second frequency, the filter having a positive input terminal for receiving the positive input signal of the differential input signal and a negative input terminal for receiving the negative input signal of the differential input signal, wherein the improvement comprises:

comparing means for comparing the positive input signal and the negative input signal, and providing a control signal that is related to the difference between the positive input signal and the negative input signal, said comparing means including a differential amplifier circuit having a positive input port, a negative input port, a positive output port and a negative output port, the positive input port is coupled to the positive input terminal of the filter, and the negative input port is coupled to the negative input terminal of the filter;

filter means for filtering the control signal, said filtering means substantially preventing the control signal from tracking the difference between the positive input signal and the negative input signal at the second frequency, while substantially allowing the control signal to track the difference between the positive input signal and the negative input signal at the first frequency;

said filter means including a first filter coupled to the positive output port of the differential amplifier circuit, and a second filter coupled to the negative output port of the differential amplifier circuit, wherein the said first filter includes a fist capacitor and said second filter includes a second capacitor, the first capacitor and the second capacitor are matched capacitors;

offset means for receiving the control signal and for providing one or more offset signals to the positive input terminal and the negative input terminal of the filter, the one or more offset signals effectively removing the difference between the positive input signal and the negative input signal of the differential input signal at the first frequency, and not substantially affecting the difference between the positive input signal and the negative input signal of the differential input signal at the second frequency, the first frequency being higher than the second frequency.

11. A filter for filtering selected frequencies from a differential input signal, wherein the differential input signal has a positive input signal and a negative input signal, the filter effectively removing a first frequency from the differential input signal while effectively passing a second frequency, the filter having a positive input terminal for receiving the positive input signal of the differential input signal and a negative input terminal for receiving the negative input signal of the differential input signal, the filter comprising:

comparing means for comparing the positive input signal and the negative input signal of the differential input signal, and providing a control signal that is related to the difference between the positive input signal and the negative input signal, said comparing means including a differential amplifier circuit having a positive input port, a negative input port, a positive output port and a negative output port, the positive input port is coupled to the positive input terminal of the filter, and the negative input port is coupled to the negative input terminal of the filter;

filter means for filtering the control signal, said filtering means substantially preventing the control signal from tracking the difference between the positive input signal and the negative input signal at the second frequency, while substantially allowing the control signal to track the difference between the positive input signal and the negative input signal at the first frequency;

offset means for receiving the control signal and for providing one or more offset signals to the positive input terminal and the negative input terminal of the filter, the one or more offset signals effectively removing the difference between the positive input signal and the negative input signal of the differential input signal at the first frequency, and not substantially affecting the difference between the positive input signal and the negative input signal of the differential input signal at the second frequency; and said offset means including a differential pair of transistors each with a gate terminal, a source terminal and a drain terminal, the gate terminal of a first one of the differential pair of transistors is coupled to the positive output port of the differential amplifier circuit, the gate of a second one of the differential pair of transistors is coupled to the negative output port of the differential amplifier circuit, the drain terminal of the first one of the differential pair of transistors is coupled to the positive input signal of the filter, the drain terminal of the second one of the differential pair of transistors is coupled to the negative input signal of the filter, the source terminal of the first one of the differential pair of transistors is coupled either directly or indirectly to a voltage supply, and the source terminal of the second one of the differential pair of transistors is coupled either directly or indirectly to the voltage supply.

12. A filter according to claim 11, wherein the one or more offset signals cause both the positive input signal and the negative input signal to have a predetermined DC reference voltage component at the first frequency.

13. A filter according to claim 11, wherein said filter means includes a first filter coupled to the positive output port of the differential amplifier circuit and a second filter coupled to the negative output port of the differential amplifier circuit.

14. A filter according to claim 13, wherein said first filter and said second filter provide an impedance that is frequency dependent.

15. A filter according to claim 14, wherein said first filter and said second filter each include a capacitance element.

16. A method for filtering a first frequency from a differential input signal while allowing a second frequency to pass relatively freely therethrough, wherein the differential input signal includes a positive input signal and a negative input signal, the method comprising the steps of:

comparing the positive input signal and the negative input signal of the differential input signal;

providing a control signal that is related to the difference between the positive input signal and the negative input signal;

filtering the control signal to substantially prevent the control signal from tracking the difference between the positive input signal and the negative input signal at the second frequency, but substantially allowing the control signal to track the difference between the positive input signal and the negative input signal at the first frequency, wherein the control signal is filtered using at least a pair of matched capacitors, the first frequency being higher than the second frequency; and providing offset signals, controlled by the control signal, to effectively cancel out the differential input signal, the offset signals effectively canceling out the differential input signal only when the control signal substantially tracks the difference between the positive input signal and the negative input signal.

17. A filter for filtering selected frequencies from an input signal, the filter effectively removing a first frequency from the input signal while effectively passing a second frequency, the filter having an input terminal for receiving the input signal, the filter comprising:

control means for providing a control signal that is related to the difference between the input signal and a reference signal; and offset means for receiving the control signal, the offset means having at least one transistor with a gate terminal, a source terminal and a drain terminal, the gate terminal being coupled to the control signal, the drain terminal being coupled to the input signal of the filter, and the source terminal being coupled either directly or indirectly to a voltage supply, the at least one transistor for providing an offset signal to the input terminal of the filter to effectively cancel out the input signal at the first frequency, while not substantially affecting the input signal at the second frequency, wherein said offset means includes a filter means for filtering the control signal, said filter means substantially preventing the control signal from tracking the input signal at the second frequency, while substantially allowing the control signal to track the input signal at the first frequency.

18. A filter according to claim 17 wherein said control means comprises a differential amplifier circuit having a first input port and a second input port, the input signal being provided to the first input port and the reference signal being provided to the second input port.

19. A filter according to claim 17 wherein said control means comprises a buffer circuit having a single input port for receiving the input signal.

20. A filter for filtering selected frequencies from an input signal, the filter effectively removing a first frequency from the input signal while effectively passing a second frequency, the filter having an input terminal for receiving the input signal, the filter comprising:

control means for providing a control signal that is related to the difference between the input signal and a reference signal;

offset means having at least one transistor with a gate terminal, a source terminal and a drain terminal, the gate terminal being coupled to the control signal, the drain terminal being coupled to the input signal of the filter, and the source terminal being coupled either directly or indirectly to a voltage supply, the at least one transistor for providing a corresponding offset signal to the input terminal of the filter; and filter means for filtering the control signal, said filtering means substantially preventing the control signal from tracking the input signal at the second frequency, while substantially allowing the control signal to track the input signal at the first frequency, the first frequency being higher than the second frequency.

21. A filter according to claim 20, wherein said reference signal is ground.

22. A filter according to claim 21, wherein said control means includes a buffer circuit having a single input port for receiving the input signal.

23. A filter according to claim 22, wherein the buffer is a non-inverting buffer.

24. A filter according to claim 22, wherein the buffer is an inverting buffer.

25. A method for filtering a first frequency from an input signal while allowing a second frequency to pass relatively freely therethrough, wherein neither the first frequency or second frequency are DC signals, the method comprising the steps of:

providing a control signal that is related to the difference between the input signal and a reference signal;

filtering the control signal to substantially prevent the control signal from tracking the difference between the input signal and the reference signal at the second frequency, but substantially allowing the control signal to track the difference between the input signal and the reference signal at the first frequency; and actively providing an offset signal, controlled by the control signal, to effectively cancel out the input signal, the offset signal effectively canceling out the input signal only when the control signal substantially tracks the difference between the input signal and the reference signal, wherein said offset signal is provided by the drain terminal of at least one transistor having a gate terminal, a source terminal and the drain terminal, with the gate terminal coupled to the control signal, the drain terminal coupled to the input signal, and the source terminal coupled either directly or indirectly to a voltage supply.

* * * * *